US012660209B2

(12) United States Patent
Kim et al.

(10) Patent No.: US 12,660,209 B2
(45) Date of Patent: Jun. 16, 2026

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Junhyoung Kim, Seoul (KR); Myunghun Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 452 days.

(21) Appl. No.: 18/297,266

(22) Filed: Apr. 7, 2023

(65) Prior Publication Data

US 2023/0403866 A1 Dec. 14, 2023

(30) Foreign Application Priority Data

Jun. 8, 2022 (KR) ......................... 10-2022-0069349

(51) Int. Cl.
*H10B 80/00* (2026.01)
*H01L 21/762* (2006.01)
(Continued)

(52) U.S. Cl.
CPC ....... *H10B 80/00* (2023.02); *H01L 21/76898* (2013.01); *H01L 23/481* (2013.01);
(Continued)

(58) Field of Classification Search
CPC ........ H10B 80/00; H10B 41/27; H10B 43/27; H10B 43/40; H10B 41/40; H10B 41/50;
(Continued)

(56) References Cited

U.S. PATENT DOCUMENTS 10,147,732 B1 12/2018 Hu et al.
10,283,452 B2 5/2019 Zhu et al.
(Continued)

FOREIGN PATENT DOCUMENTS

KR 10-2021-0025032 A 3/2021
KR 10-2022-0042932 A 4/2022

OTHER PUBLICATIONS

Office Action in Korean Appln. No. 10-2022-0069349, mailed on Nov. 30, 2025, 16 pages (with English translation).

*Primary Examiner* — Mamadou L Diallo
(74) *Attorney, Agent, or Firm* — Fish & Richardson P.C.

(57) ABSTRACT

A semiconductor device may include a first substrate structure including a plate layer, gate electrodes stacked on the plate layer, channel structures penetrating through the gate electrodes, and first bonding metal layers on the channel structures; and a second substrate structure connected to the first substrate structure, and including a substrate having active regions, device isolation layers in the substrate defining the active regions, circuit devices on one surface of the substrate, and second bonding metal layers connected to the first bonding metal layers, the device isolation layers including first device isolation layers and a second device isolation layer having different heights, and the active regions including first active regions spaced apart by the first device isolation layers and connected to each other by the substrate, and second active regions separated from the first active regions by the second device isolation layer.

20 Claims, 17 Drawing Sheets

(51) Int. Cl.

| | |
|---|---|
| *H01L 21/768* | (2006.01) |
| *H01L 23/00* | (2006.01) |
| *H01L 23/48* | (2006.01) |
| *H01L 23/528* | (2006.01) |
| *H10B 41/27* | (2023.01) |
| *H10B 43/27* | (2023.01) |

(52) U.S. Cl.
CPC ............ *H01L 23/528* (2013.01); *H01L 24/05* (2013.01); *H01L 24/08* (2013.01); *H01L 21/76283* (2013.01); *H01L 24/80* (2013.01); *H01L 2224/05571* (2013.01); *H01L 2224/05647* (2013.01); *H01L 2224/08145* (2013.01); *H01L 2224/80009* (2013.01); *H01L 2224/80357* (2013.01); *H01L 2224/80379* (2013.01); *H01L 2224/80895* (2013.01); *H01L 2224/80896* (2013.01); *H01L 2924/0504* (2013.01); *H01L 2924/0544* (2013.01); *H01L 2924/059* (2013.01); *H01L 2924/14511* (2013.01); *H10B 41/27* (2023.02); *H10B 43/27* (2023.02)

(58) Field of Classification Search
CPC .................... H10B 43/50; H01L 24/80; H01L 2224/08145; H01L 2924/059; H01L 21/76898; H01L 23/481; H01L 23/528; H01L 24/05; H01L 24/08; H01L 2224/05571; H01L 2224/05647; H01L 2224/80357; H01L 2224/80895; H01L 2224/80896

See application file for complete search history.

(56) References Cited

U.S. PATENT DOCUMENTS

| | | | | |
|---|---|---|---|---|
| 10,804,202 | B2 | 10/2020 | Nishida | |
| 11,177,343 | B2 | 11/2021 | Gan et al. | |
| 11,195,857 | B2 | 12/2021 | Kai et al. | |
| 2020/0303284 | A1 | 9/2020 | Yang et al. | |
| 2021/0066274 | A1* | 3/2021 | Chen | H01L 23/5283 |
| 2021/0074638 | A1* | 3/2021 | Sanuki | H01L 23/485 |
| 2021/0082865 | A1 | 3/2021 | Baraskar et al. | |
| 2021/0118902 | A1* | 4/2021 | Kanamori | H01L 21/02532 |
| 2021/0384221 | A1* | 12/2021 | Song | G11C 11/5657 |

* cited by examiner

SEMICONDUCTOR DEVICES AND DATA STORAGE SYSTEMS INCLUDING THE SAME

CROSS-REFERENCE TO RELATED APPLICATION(S)

This application claims benefit of priority to Korean Patent Application No. 10-2022-0069349 filed on Jun. 8, 2022 in the Korean Intellectual Property Office, the disclosure of which is incorporated herein by reference in its entirety.

BACKGROUND

The present inventive concepts relates to semiconductor devices and data storage systems including the same.

In a data storage system requiring data storage, a semiconductor device for storing high-capacity data may be required. Accordingly, methods for increasing data storage capacity of semiconductor devices are being researched. For example, as a method for increasing data storage capacity of a semiconductor device, a semiconductor device including memory cells arranged three-dimensionally, instead of memory cells arranged two-dimensionally, has been proposed.

SUMMARY

One of the technical problems to be achieved by the present inventive concepts are to provide semiconductor devices with an improved degree of integration.

One of the technical problems to be achieved by the present inventive concepts are to provide data storage systems including semiconductor devices having an improved degree of integration.

According to some aspects of the present inventive concepts, a semiconductor device includes a first substrate structure including a plate layer, gate electrodes spaced apart from each other and stacked on the plate layer in a first direction, perpendicular to an upper surface of the plate layer, channel structures penetrating through the gate electrodes, extending in the first direction, and each of the channel structures respectively including a channel layer, a first interconnection structure on the gate electrodes and electrically connected to the gate electrodes and the channel structures, and first bonding metal layers on the first interconnection structure; and a second substrate structure connected to the first substrate structure on the first substrate structure, and the second substrate structure including a substrate having active regions, device isolation layers in the substrate defining the active regions, circuit devices on a lower surface of the substrate, a second interconnection structure below the circuit devices and electrically connected to the circuit devices, a third interconnection structure on the substrate, and second bonding metal layers below the second interconnection structure and connected to the first bonding metal layers. The device isolation layers include first device isolation layers having a first height in the first direction, and a second device isolation layer penetrating entirely through the substrate in the first direction and having a second height, greater than the first height, the active regions include first active regions spaced apart by the first device isolation layers and connected to each other by the substrate, and a second active region separated from the first active regions by the second device isolation layer, the third interconnection structure includes upper contact plugs connected to an upper portion of the substrate, and a via penetrating through the second device isolation layer and electrically connected to the second interconnection structure.

According to some aspects of the present inventive concepts, a semiconductor device includes a first substrate structure including a plate layer, gate electrodes spaced apart from each other and stacked on the plate layer in a first direction, perpendicular to an upper surface of the plate layer, channel structures penetrating through the gate electrodes, extending in the first direction, and each of the channel structures respectively including a channel layer, and first bonding metal layers on the channel structures; and a second substrate structure connected to the first substrate structure, the second substrate structure including a substrate having active regions, device isolation layers in the substrate defining the active regions, circuit devices on one surface of the substrate, and second bonding metal layers connected to the first bonding metal layers. The device isolation layers include first device isolation layers and a second device isolation layer having different heights, and the active regions include first active regions spaced apart by the first device isolation layers and connected to each other by the substrate, and second active regions separated from the first active regions by the second device isolation layer.

According to some aspects of the present inventive concepts, a data storage system includes a semiconductor storage device including a first substrate structure including gate electrodes and first bonding metal layers, a second substrate structure including a substrate including active regions, and device isolation layers in the substrate defining the active regions and including first device isolation layers and a second device isolation layer having different heights, the active regions including first active regions spaced apart by the first device isolation layers and connected to each other by the substrate, and second active regions separated from the first active regions by the second device isolation layer, circuit devices electrically connected to the gate electrodes, and second bonding metal layers connected to the first bonding metal layers, and an input/output pad electrically connected to the circuit devices; and a controller electrically connected to the semiconductor storage device through the input/output pad and configured to control the semiconductor storage device.

BRIEF DESCRIPTION OF DRAWINGS

The above and other aspects, features, and advantages of the present inventive concepts will be more clearly understood from the following detailed description, taken in conjunction with the accompanying drawings, in which:

FIGS. 7A to 7I are schematic cross-sectional views illustrating a method of manufacturing a semiconductor device according to some example embodiments.

DETAILED DESCRIPTION

Figure 1:
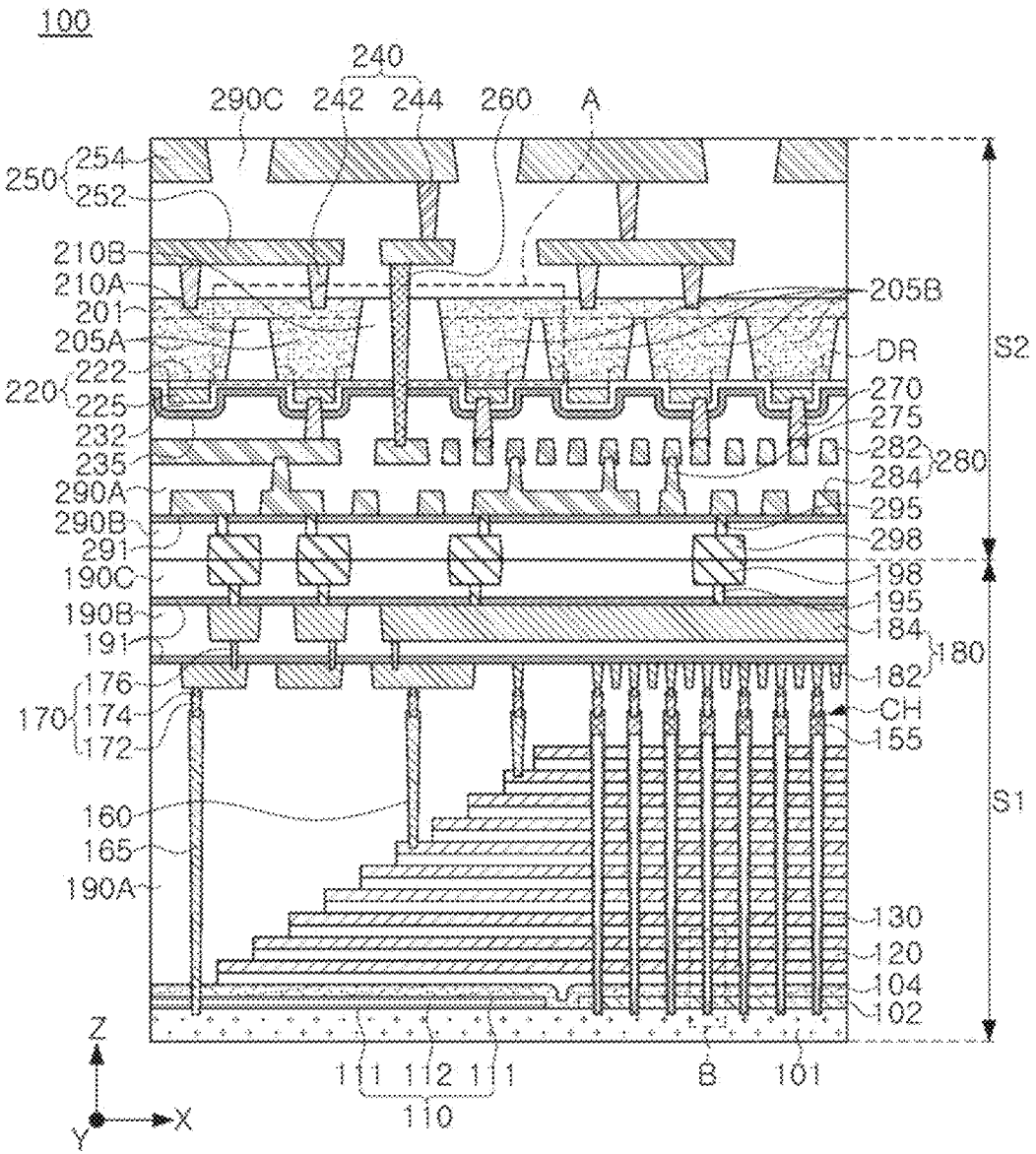
FIG. 1 is a schematic cross-sectional view of a semiconductor device according to some example embodiments.

Hereinafter, example embodiments of the present inventive concepts will be described with reference to the accompanying drawings. Hereinafter, it can be understood that terms such as 'on,' 'upper,' 'upper portion,' 'upper surface,' 'below,' 'lower,' 'lower portion,' 'lower surface,' 'side surface,' and the like may be denoted by reference numerals and refer to the drawings, except where otherwise indicated.

FIG. 1 is a schematic cross-sectional view of a semiconductor device according to some example embodiments.

Figure 2A:
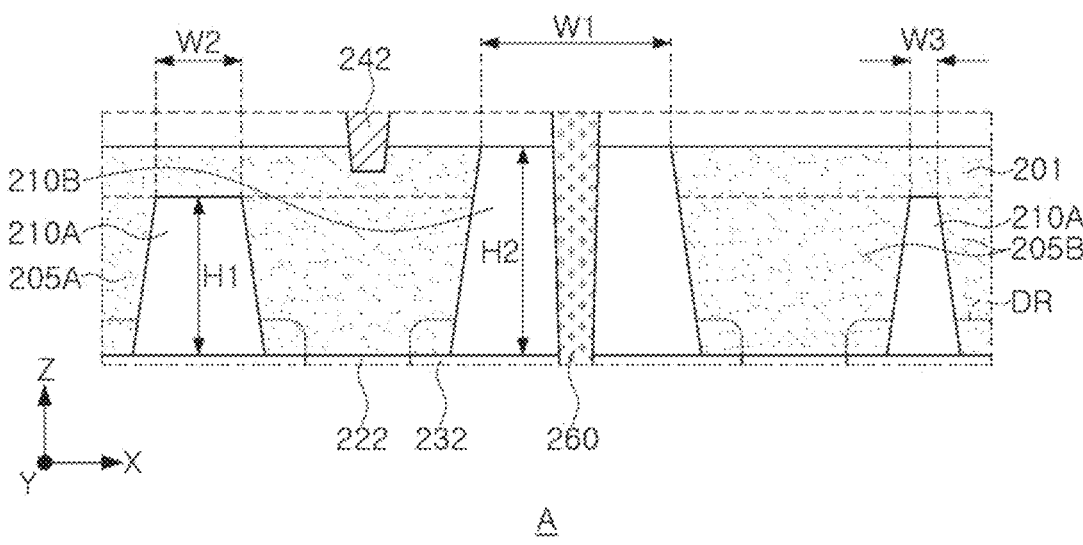
FIGS. 2A and 2B are partially enlarged views of a semiconductor device according to some example embodiments.
Figure 2B:
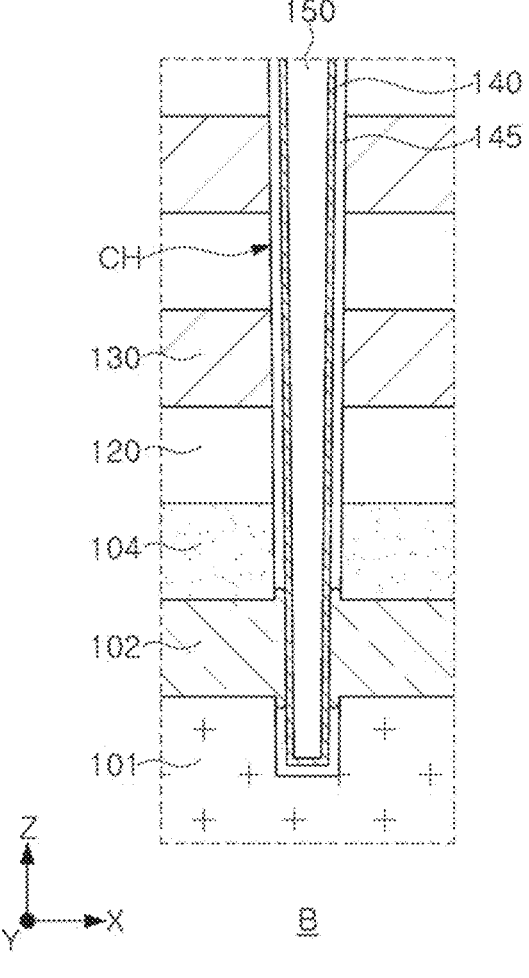

FIGS. 2A and 2B are partially enlarged views of a semiconductor device according to some example embodiments. FIG. 2A is an enlarged view of portion 'A' of FIG. 1, and FIG. 2B is an enlarged view of portion 'B' of FIG. 1.

Figure 3:
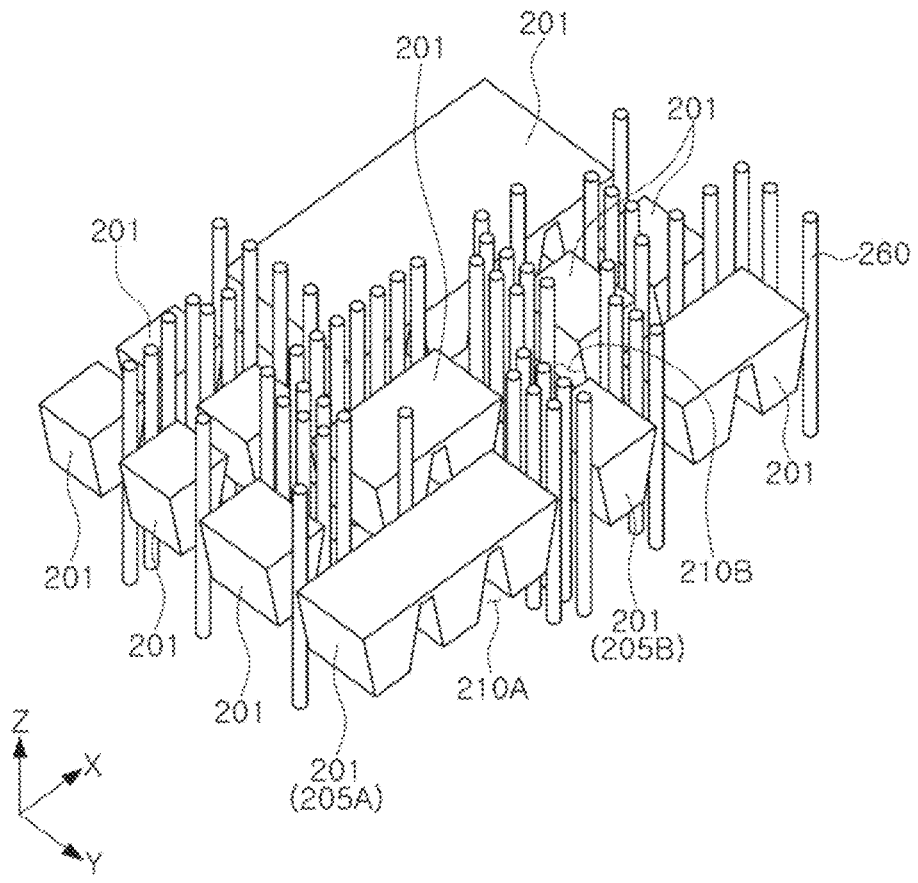
FIG. 3 is a schematic perspective view of some configurations of a semiconductor device according to some example embodiments.

FIG. 3 is a schematic perspective view of some configurations of a semiconductor device according to some example embodiments.

First, referring to FIGS. 1 to 2B, a semiconductor device 100 may include first and second substrate structures S1 and S2 stacked vertically. For example, the first substrate structure S1 may include a memory cell region of the semiconductor device 100, and the second substrate structure S2 may include a peripheral circuit region of the semiconductor device 100.

The first substrate structure S1 may include a plate layer 101, first and second horizontal conductive layers 102 and 104 on the plate layer 101, gate electrodes 130 stacked on the first and second horizontal conductive layers 102 and 104, interlayer insulating layers 120 alternately stacked with the gate electrodes 130, and channel structures CH disposed to pass through the gate electrodes 130. The first substrate structure S1 may further include gate contacts 160 connected to the gate electrodes 130, a substrate contact 165, cell contact plugs 170, and cell interconnection lines 180, as a first interconnection structure. The first substrate structure S1 may further include first bonding vias 195 and first bonding metal layers 198 as a first bonding structure. The first substrate structure S1 may further include a horizontal insulating layer 110, first to third cell region insulating layers 190A, 190B, and 190C, and lower protective layers 191.

The plate layer 101 may have an upper surface extending in an X-direction and a Y-direction. The plate layer 101 may have a shape continuously extending over the entire semiconductor device 100 as illustrated in FIG. 1. In some example embodiments, the plate layer 101 may have a shape removed from some regions outside the gate electrodes 130. In this case, a semiconductor layer disposed below the plate layer 101 may be further included. The plate layer 101 may include a conductive material. For example, the plate layer 101 may include a semiconductor material, such as a group IV semiconductor, a group III-V compound semiconductor, or a group II-VI compound semiconductor. For example, the group IV semiconductor may include silicon, germanium, and/or silicon-germanium. The plate layer 101 may further include impurities. The plate layer 101 may be provided as a polycrystalline semiconductor layer such as a polycrystalline silicon layer, or an epitaxial layer, or may be provided as a single crystal bulk wafer.

The first and second horizontal conductive layers 102 and 104 may be sequentially stacked and disposed on the plate layer 101. The first and second horizontal conductive layers 102 and 104 may form a source structure, together with the plate layer 101. The first horizontal conductive layer 102 may not extend onto a region of the plate layer 101 in which the channel structures CH are not disposed, and the second horizontal conductive layer 104 may be extended onto an entire region of the plate layer 101. The first horizontal conductive layer 102 may function as a portion of a common source line of the semiconductor device 100, and may function, for example, as the common source line, together with the plate layer 101. As illustrated in the enlarged view of FIG. 2B, the first horizontal conductive layer 102 may be directly connected to the channel layer 140 around the channel layer 140. The second horizontal conductive layer 104 may be in contact with the plate layer 101 in some regions in which the first horizontal conductive layer 102 and the horizontal insulating layer 110 are not disposed.

The first and second horizontal conductive layers 102 and 104 may include a semiconductor material, and, for example, both the first and second horizontal conductive layers 102 and 104 may include polycrystalline silicon. At least, the first horizontal conductive layer 102 may be a doped layer. A material of the second horizontal conductive layer 104 may not be limited to the semiconductor material, and may be replaced with an insulating layer.

The horizontal insulating layer 110 may be disposed on the same level as the first horizontal conductive layer 102 in a region in which the first horizontal conductive layer 102 is not disposed. The horizontal insulating layer 110 may include first and second horizontal insulating layers 111 and 112 alternately stacked on the plate layer 101. The horizontal insulating layer 110 may be layers remaining after replacing a portion with the first horizontal conductive layer 102 in a process of manufacturing the semiconductor device 100.

The horizontal insulating layer 110 may include silicon oxide, silicon nitride, silicon carbide, and/or silicon oxynitride. The first horizontal insulating layers 111 and the second horizontal insulating layer 112 may include different insulating materials. For example, the first horizontal insulating layers 111 may be formed of a material, identical to a material of the interlayer insulating layers 120, and the second horizontal insulating layer 112 may be formed of a material, different from the material of the interlayer insulating layers 120.

The gate electrodes 130 may be vertically spaced apart and stacked on the plate layer 101, to form a stack structure, together with the interlayer insulating layers 120. The gate electrodes 130 may include at least one lower gate electrode forming a gate of a ground select transistor, memory gate electrodes forming a plurality of memory cells, and upper gate electrodes forming gates of string select transistors. The number of the memory gate electrodes constituting the memory cells may be determined according to the capacity of the semiconductor device 100. According to some example embodiments, the number of the upper and lower gate electrodes may be 1 to 4 or more, respectively, and may have the same or different structure as the memory gate electrodes. In some example embodiments, the gate electrodes 130 may be disposed below the lower gate electrode and/or on the upper gate electrode, and may further include a gate electrode 130 constituting an erase transistor used for an erase operation using a gate induced drain leakage (GIDL) phenomenon.

The gate electrodes 130 may be vertically spaced apart from each other and stacked, and may extend to have different lengths in outer regions, to form a stepped structure. Due to the stepped structure, among the gate electrodes 130, a lower gate electrode 130 may extend further than an upper gate electrode 130, to have regions in which lower surfaces are exposed from the interlayer insulating layers 120 and other gate electrodes 130 in a downward direction, and may be connected to the gate contacts 160 in the regions. In some example embodiments, the gate electrodes 130 may have an increased thickness in the regions.

The gate electrodes 130 may include a metal material, for example, tungsten (W). In some example embodiments, the gate electrodes 130 may include polycrystalline silicon or a metal silicide material. In some example embodiments, the gate electrodes 130 may further include a diffusion barrier (not shown), and, for example, the diffusion barrier may include tungsten nitride (WN), tantalum nitride (TaN), titanium nitride (TiN), or a combination thereof.

The interlayer insulating layers 120 may be alternately disposed with the gate electrodes 130. Like the gate electrodes 130, the interlayer insulating layers 120 may be spaced apart from each other in a direction, perpendicular to the upper surface of the plate layer 101, and may be disposed to extend in the X-direction. The interlayer insulating layers 120 may include an insulating material such as a silicon oxide or silicon nitride.

The channel structures CH may be disposed on the plate layer 101 to be spaced apart from each other while forming rows and columns. The channel structures CH may be disposed to form a grid pattern or, alternatively, may be disposed in a zigzag shape in one direction. The channel structures CH may have a pillar shape, and may have inclined side surfaces to decrease a width toward the plate layer 101 according to an aspect ratio. In some example embodiments, each of the channel structures CH may have a form in which a plurality of channel structures may be stacked in the Z-direction to be connected to each other, and may have a bent portion due to a difference or change in width in the connection region.

As illustrated in FIG. 2B, each of the channel structures CH may include a channel layer 140, a gate dielectric layer 145, a channel buried insulating layer 150, and a channel pad 155, arranged in a channel hole. The channel layer 140 may be formed in an annular shape surrounding the channel buried insulating layer 150 therein, but may have a pillar shape such as a column or a prism without the channel buried insulating layer 150 according to some example embodiments. The channel layer 140 may be connected to the first horizontal conductive layer 102 in a lower portion. The channel layer 140 may include a semiconductor material such as polycrystalline silicon or single crystal silicon.

The gate dielectric layer 145 may be disposed between the gate electrodes 130 and the channel layer 140. The gate dielectric layer 145 may extend vertically along the channel layer 140. In some example embodiments, at least a portion of the gate dielectric layer 145 may extend horizontally along upper and lower surfaces of the gate electrodes 130. Although not specifically illustrated, the gate dielectric layer 145 may include a tunneling layer, a charge storage layer, and a blocking layer, sequentially stacked from the channel layer 140. The tunneling layer may tunnel charges into the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high-κ dielectric material, or a combination thereof. A channel pad 155 may include, for example, doped polycrystalline silicon.

The gate contacts 160, the substrate contact 165, the cell contact plugs 170, and the cell interconnection lines 180 may form a first interconnection structure.

The gate contacts 160 may pass through the first cell region insulating layer 190A to be connected to the gate electrodes 130. The substrate contact 165 may be connected to the plate layer 101.

The cell contact plugs 170 may include first to third cell contact plugs 172, 174, and 176, and the cell interconnection lines 180 may include first and second cell interconnection lines 182 and 184. The channel pads 155, the gate contacts 160, and the substrate contact 165 may be connected to the first cell contact plugs 172 on upper ends thereof. The first cell contact plugs 172 may be connected to the second cell contact plugs 174 on upper ends thereof, and the second cell contact plugs 174 may be connected to the first cell interconnection lines 182 on upper ends thereof. The third cell contact plugs 176 may vertically connect the first and second cell interconnection lines 182 and 184 to each other. The cell contact plugs 170 may have a cylindrical shape. In some example embodiments, the cell contact plugs 170 may have inclined side surfaces to decrease a width toward the plate layer 101 and to increase a width toward the second substrate structure S2 according to an aspect ratio.

The first cell interconnection lines 182 may include bit lines connected to the channel structures CH, and interconnection lines disposed on the same height level as the bit lines. The second cell interconnection lines 184 may be interconnection lines disposed on the first cell interconnection lines 182. The cell interconnection lines 180 may have a linear shape extending in at least one direction. In some example embodiments, each of the second cell interconnection lines 184 may have a thickness, greater than a thickness of each of the first cell interconnection lines 182. The cell interconnection lines 180 may have inclined side surfaces to decrease a width toward the plate layer 101. In some example embodiments, the number of layers forming the cell contact plugs 170 and the cell interconnection lines 180 may be variously changed.

The gate contacts 160, the substrate contact 165, the cell contact plugs 170, and the cell interconnection lines 180 may include, for example, tungsten (W), aluminum (Al), copper (Cu), tungsten nitride (WN), tantalum nitride (TaN), titanium nitride (TiN), or a combination thereof.

The first bonding vias 195 and the first bonding metal layers 198 may form a first bonding structure, and may allow the first substrate structure S1 to be electrically and physically connected to the second substrate structure S2.

The first bonding vias 195 may be disposed on the second cell interconnection lines 184 to be connected to the second cell interconnection lines 184, and the first bonding metal layers 198 may be connected to the first bonding vias 195. An upper surface of the first bonding metal layers 198 may form an upper surface of the first substrate structure S1. The first bonding metal layers 198 may be bonded to and connected to the second bonding metal layers 298 of the second substrate structure S2. The first bonding vias 195 and the first bonding metal layers 198 may include a conductive material, for example, copper (Cu).

The first to third cell region insulating layers 190A, 190B, and 190C may be disposed to cover the gate electrodes 130 and the first interconnection structure. The first cell region insulating layer 190A may cover the gate electrodes 130 and the channel structures CH, the second cell region insulating layer 190B may cover the first cell interconnection lines 182, and the third cell region insulating layer 190C may cover the second cell interconnection lines 184. The first to third cell region insulating layers 190A, 190B, and 190C may be formed of an insulating material, and may each include a plurality of insulating layers. The third cell region insulating layer 190C may include a bonding insulating layer having a predetermined (or, alternatively, desired) thickness, from an upper surface thereof. In this case, the bonding insulating layer may form dielectric-dielectric bonds with the bonding insulating layer of the second substrate structure S2. The bonding insulating layer may include, for example, at least one of SiO, SiN, SiCN, SiOC, SiON, or SiOCN.

The lower protective layers 191 may be respectively disposed on upper surfaces of the first and second cell interconnection lines 182 and 184. The lower protective layers 191 may be layers for preventing or reducing contamination of upper layers from a metal material of the first and second cell interconnection lines 182 and 184. The lower protective layers 191 may be formed of an insulating material different from that of the first to third cell region insulating layers 190A, 190B, and 190C, and may include, for example, silicon nitride. In some example embodiments, the lower protective layers 191 may be omitted.

The second substrate structure S2 may include a substrate 201 including first and second active regions 205A and 205B, first and second device isolation layers 210A and 210B in the substrate 201, circuit devices 220 disposed on a lower surface of the substrate 201, and first to third peripheral region insulating layers 290A, 290B, and 290C. The second substrate structure S2 may further include first and second lower circuit contact plugs 270 and 275 and lower circuit interconnection lines 280, as a second interconnection structure, and may further include upper circuit contact plugs 240, upper circuit interconnection lines 250, and vias 260, as a third interconnection structure. The second substrate structure S2 may further include second bonding vias 295 and second bonding metal layers 298 as a second bonding structure. The second substrate structure S2 may further include a gate capping layer 232, an etch stop layer 235, and an upper protective layers 291.

The substrate 201 may be separated as a plurality of substrates 201, and disposed by the second device isolation layer 210B. The substrate 201 may include a semiconductor material, for example, a group IV semiconductor, a group III-V compound semiconductor, or a group II-VI compound semiconductor. For example, the substrate 201 may be provided as a single crystal bulk wafer.

The substrate 201 may include active regions including first and second active regions 205A and 205B. Among the active regions, the first active regions 205A and the second active regions 205B refer to active regions adjacent to each other and separated from each other by the second device isolation layer 210B. The first active regions 205A and the second active regions 205B may have an island shape, respectively, and may be spaced apart from each other. Well regions including impurities may be disposed in a portion of the substrate 201 including lower surfaces of the first and second active regions 205A and 205B, and source/drain regions DR may be disposed in lower portions of the well regions.

The first and second active regions 205A and 205B may be defined in a lower region of the substrate 201 by the first and second device isolation layers 210A and 210B. The first active regions 205A may be spaced apart from each other by the first device isolation layers 210A, and the second active regions 205B may be spaced apart from each other by the first device isolation layers 210A. The substrate 201 may extend onto upper surfaces of the first active regions 205A and onto upper surfaces of the first device isolation layers 210A. The substrate 201 may extend onto upper surfaces of the second active regions 205B and onto upper surfaces of the first device isolation layers 210A. The first active regions 205A may be connected to each other by an upper region of the substrate 201, and the second active regions 205B may also be connected to each other by the upper region of the substrate 201. The first active regions 205A and the second active regions 205B may be completely separated from each other by the second device isolation layer 210B. The first active regions 205A may receive the same electrical signal through first upper circuit contact plugs 242, and the second active regions 205B may receive the same electrical signal through first upper circuit contact plugs 242.

The first and second active regions 205A and 205B may further include impurities. For example, the first active regions 205A and the second active regions 205B may include impurities of different conductivity types.

The first and second device isolation layers 210A and 210B may extend from the lower surface of the substrate 201 toward an upper surface of the substrate 201. The first and second device isolation layers 210A and 210B may be formed by, for example, a shallow trench isolation (STI) process. Each of the first and second device isolation layers 210A and 210B may have a width on an upper surface, narrower than a width on a lower surface, and may thus have inclined side surfaces.

The first and second device isolation layers 210A and 210B may have different depths or different heights, from the lower surface of the substrate 201. As illustrated in FIG. 2A, each of the first device isolation layers 210A may have a first height H1, and the second device isolation layer 210B may have a second height H2, greater than the first height H1. The second height H2 may be substantially equal to a thickness of the substrate 201. Therefore, the second device isolation layer 210B may entirely penetrate through the substrate 201. An upper surface of the second device isolation layer 210B may be located on substantially the same level as the upper surface of the substrate 201 and may be coplanar. Lower surfaces of the first and second device isolation layers 210A and 210B may be located on the same or lower level than the lower surface of the substrate 201.

A first width W1 in one direction of the second device isolation layer 210B may be equal to or greater than a width W2 and a width W3 of the first device isolation layers 210A. Since the second device isolation layer 210B may completely pass through the substrate 201 to separate the first active regions 205A and the second active regions 205B, electrical isolation may be achieved even with a relatively small width. Therefore, a degree of integration of the semiconductor device 100 may be improved. For example, the first width W1 may be in a range of about 30 nm to about 300 nm, for example, a range of about 30 nm to about 100 nm. The widths W2 and W3 of the first device isolation layers 210A may be the same or different from each other in different regions of the substrate 201, and may be determined, respectively, in consideration of a magnitude of voltage applied to the circuit devices 220 or the like.

The first and second device isolation layers 210A and 210B may be formed of an insulating material, and may include, for example, an oxide, a nitride, or a combination thereof.

As illustrated in FIG. 3, the substrate 201 may be separated into a plurality of island regions by the second device isolation layer 210B. Active regions including first and second active regions 205A and 205B defined by first device isolation layers 210A may be defined in each the substrates 201. The second device isolation layer 210B may surround the first active regions 205A, and may surround the second active regions 205B. The second device isolation layer 210B may surround outermost side surfaces of the first active regions 205A, and may surround outermost side surfaces of the second active regions 205B. The first active regions 205A, that is, a group of the first active regions 205A, may be surrounded by the second device isolation layer 210B on an X-Y plane, and the second active regions 205B, that is, a group of the second active regions 205B, may be surrounded by the second device isolation layer 210B on the X-Y plane. In some example embodiments, arrangement of the second device isolation layer 210B and arrangement of the substrate 201 may be variously changed.

The circuit devices 220 may be disposed on lower surfaces of the first and second active regions 205A and 205B. The circuit devices 220 may form a planar transistor. Each of the circuit devices 220 may include a circuit gate dielectric layer 222 and a circuit gate electrode layer 225. The source/drain regions DR may be disposed in the substrate 201 on both sides of the circuit gate electrode layer 225. In some example embodiments, an NMOS may be disposed on a lower surface of the first active regions 205A, and a PMOS may be disposed on a lower surface of the second active regions 205B, or vice versa.

The circuit gate dielectric layer 222 may include an oxide, a nitride, and/or a high-κ material. The high-κ material may refer to a dielectric material having a dielectric constant, higher than a dielectric constant of a silicon oxide layer ($SiO_2$). In some example embodiments, the circuit gate dielectric layer 222 may be formed as a multilayer film. The circuit gate electrode layer 225 may include a conductive material, and may include, for example, a semiconductor material such as a metal nitride such as titanium nitride (TiN), tantalum nitride (TaN), or tungsten nitride (WN), and/or a metal material such as aluminum (Al), tungsten (W), or molybdenum (Mo), or doped polysilicon. In some example embodiments, the circuit gate electrode layer 225 may be formed as a multilayer film.

The gate capping layer 232 and the etch stop layer 235 may be sequentially disposed on lower surfaces of the circuit devices 220. The gate capping layer 232 and the etch stop layer 235 may extend onto the lower surfaces of the first and second device isolation layers 210A and 210B and the lower surfaces of the first and second active regions 205A and 205B. The gate capping layer 232 may include spacer layers on both sidewalls of the circuit devices 220. The gate capping layer 232 may include an insulating material, for example, silicon oxide, silicon nitride, silicon carbide, and/or silicon oxynitride. The etch stop layer 235 may include a material, different from a material of the first peripheral region insulating layer 290A, and may be used as an etch stop layer when the first lower circuit contact plugs 270 are formed. In some example embodiments, the etch stop layer 235 may be omitted.

The first and second lower circuit contact plugs 270 and 275 and the lower circuit interconnection lines 280 may form a second interconnection structure. The second interconnection structure may be an interconnection structure located below the substrate 201 in the second substrate structure S2. The second interconnection structure may include, for example, interconnections for electrically connecting the circuit devices 220 and the first substrate structure S1. The lower circuit interconnection lines 280 may include first and second lower circuit interconnection lines 282 and 284.

The first lower circuit contact plugs 270 may pass through the first peripheral region insulating layer 290A, to be connected to the circuit gate electrode layers 225. In a region not illustrated, the first lower circuit contact plugs 270 may also be connected to the source/drain regions DR. The second lower circuit contact plugs 275 may vertically connect the first and second lower circuit interconnection lines 282 and 284. The second lower circuit contact plugs 275 may be integrated with the second lower circuit interconnection lines 284, but the present inventive concepts are not limited thereto. The first and second lower circuit contact plugs 270 and 275 may have a cylindrical shape. The lower circuit interconnection lines 280 may have a linear shape extending in at least one direction.

In some example embodiments, at least some of the first lower circuit contact plugs 270 and the lower circuit interconnection lines 280 may have inclined side surfaces to decrease a width toward the substrate 201 and to increase a width toward the first substrate structure S1. In some example embodiments, the number of layers forming the first and second lower circuit contact plugs 270 and 275 and the lower circuit interconnection lines 280 may be variously changed.

The first and second lower circuit contact plugs 270 and 275 and the lower circuit interconnection lines 280 may be formed of, for example, tungsten (W), aluminum (Al), copper (Cu), tungsten nitride (WN), tantalum nitride (TaN), titanium nitride (TiN), or a combination thereof.

The upper circuit contact plugs 240, the upper circuit interconnection lines 250, and the via 260 may form a third interconnection structure. The third interconnection structure may include an interconnection structure located on the substrate 201 in the second substrate structure S2. The third interconnection structure may include, for example, power interconnections for supplying a power voltage or a ground voltage to the circuit devices 220. The upper circuit contact plugs 240 may include first and second upper circuit contact plugs 242 and 244, and the upper circuit interconnection lines 250 may include first and second upper circuit interconnection lines 252 and 254.

Lower ends of the first upper circuit contact plugs 242 may be connected to an upper portion of the substrate 201 to apply an electrical signal, e.g., a body voltage, to the first and second active regions 205A and 205B. Upper ends of the first upper circuit contact plugs 242 may be connected to the first upper circuit interconnection lines 252. First upper circuit contact plugs 242 connected to the first active regions 205A and first upper circuit contact plugs 242 connected to the second active regions 205B may be connected to different circuit interconnection lines 252. The second upper circuit contact plugs 244 may vertically connect the first and second upper circuit interconnection lines 252 and 254 to each other.

In some example embodiments, at least some of the upper circuit contact plugs 240 and the upper circuit interconnection lines 250 may have inclined side surfaces to decrease a width toward the substrate 201. Therefore, a width on each of the upper surfaces may be wider than a width on each of the lower surfaces. As illustrated in FIG. 1, the second upper circuit interconnection lines 254 may have inclined side surfaces to increase a width toward the substrate 201 and the first substrate structure S1, but the present inventive concepts are not limited thereto. In some example embodiments, the number of layers forming the upper circuit contact plugs 240 and the upper circuit interconnection lines 250 may be variously changed.

The via 260 may connect a configuration except for the via 260 in the third interconnection structure to the second interconnection structure. Specifically, the via 260 may penetrate through the second device isolation layer 210B, to directly connect the second upper circuit interconnection line 252 and the first lower circuit interconnection line 282. The via 260 may further penetrate through the gate capping layer 232 and the etch stop layer 235 below the second device isolation layer 210B. The via 260 may be formed together with the first upper circuit contact plugs 242 such that upper surfaces of the vias 260 may be located on the same level as upper surfaces of the first upper circuit contact plugs 242, but the present inventive concepts are not limited thereto. The via 260 may have an inclined side surface to decrease a width toward the first substrate structure S1. Therefore, a width on an upper surface may be wider than a width on a lower surface.

As illustrated in FIG. 3, the vias 260 may be arranged as a plurality of vias 260 to penetrate through the second device isolation layer 210B. In some example embodiments, the number and shapes of the vias 260 may be variously changed.

Since the third interconnection structure may be disposed on a different surface from the second interconnection structure, with respect to the substrate 201, a structure for a body contact such as a guard band may be omitted. Therefore, a degree of integration of the semiconductor device 100 may be further improved. In addition, since the second interconnection structure and the third interconnection structure transmit different types of electrical signals, arrangement of the interconnection structure may be easy. For example, the second interconnection structure may be configured to include interconnections for electrical connection with the first substrate structure S1, and the third interconnection structure may be configured to include power interconnections.

The second bonding vias 295 and the second bonding metal layers 298 may form a second bonding structure, and may be configured to electrically and physically connect the second substrate structure S2 and the first substrate structure S1.

The second bonding vias 295 may be disposed below the second lower circuit interconnection lines 284, to be connected to the second lower circuit interconnection lines 284, and the second bonding metal layers 298 may be disposed below the second bonding vias 295, to connected to the second bonding vias 295. The second bonding vias 295 may have a cylindrical shape, and the second bonding metal layers 298 may have a linear shape or a pad shape. Lower surfaces of the second bonding metal layers 298 may form a lower surface of the second substrate structure S2. The second bonding metal layers 298 may be bonded and connected to the first bonding metal layers 198 of the first substrate structure S1. The second bonding vias 295 and the second bonding metal layers 298 may include a conductive material, for example, copper (Cu). In some example embodiments, the first and second bonding structures may be disposed only for bonding without being connected to each of the first and second interconnection structures.

The first peripheral region insulating layer 290A may cover lower surfaces of the circuit devices 220, the second peripheral region insulating layer 290B may cover the second lower circuit interconnection lines 284, and the third peripheral region insulating layer 290C may cover the upper surface of the substrate 201. The first to third peripheral region insulating layers 290A, 290B, and 290C may be formed of an insulating material, and may each include a plurality of insulating layers. The second peripheral region insulating layer 290B may include a bonding insulating layer having a predetermined (or, alternatively, desired) thickness from a lower surface. In this case, the bonding insulating layer may form a dielectric-dielectric bonding with a bonding insulating layer of the first substrate structure S1. The bonding insulating layer may include, for example, at least one of SiO, SiN, SiCN, SiOC, SiON, or SiOCN.

The first and second substrate structures S1 and S2 may be bonded by bonding the first bonding metal layers 198 and the second bonding metal layers 298 and bonding the bonding insulating layers. The bonding of the first bonding metal layers 198 and the second bonding metal layers 298 may be, for example, copper (Cu)-to-copper (Cu) bonding, and the bonding of the bonding insulating layers may be, for example, dielectric-dielectric bonding, such as SiCN-to-SiCN bonding. The first and second substrate structures S1 and S2 may be bonded by hybrid bonding including copper (Cu)-to-copper (Cu) bonding and dielectric-dielectric bonding.

The upper protective layer 291 may be disposed on lower surfaces of the second lower circuit interconnection lines 284. The upper protective layer 291 may be a layer for preventing or reducing contamination of the second lower circuit interconnection lines 284 disposed thereon due to a metal material. The upper protective layer 291 may be formed of an insulating material different from that of the first and second peripheral region insulating layers 290A and 290B, and may include, for example, silicon nitride. In some example embodiments, the upper protective layer 291 may be omitted.

Figure 4A:
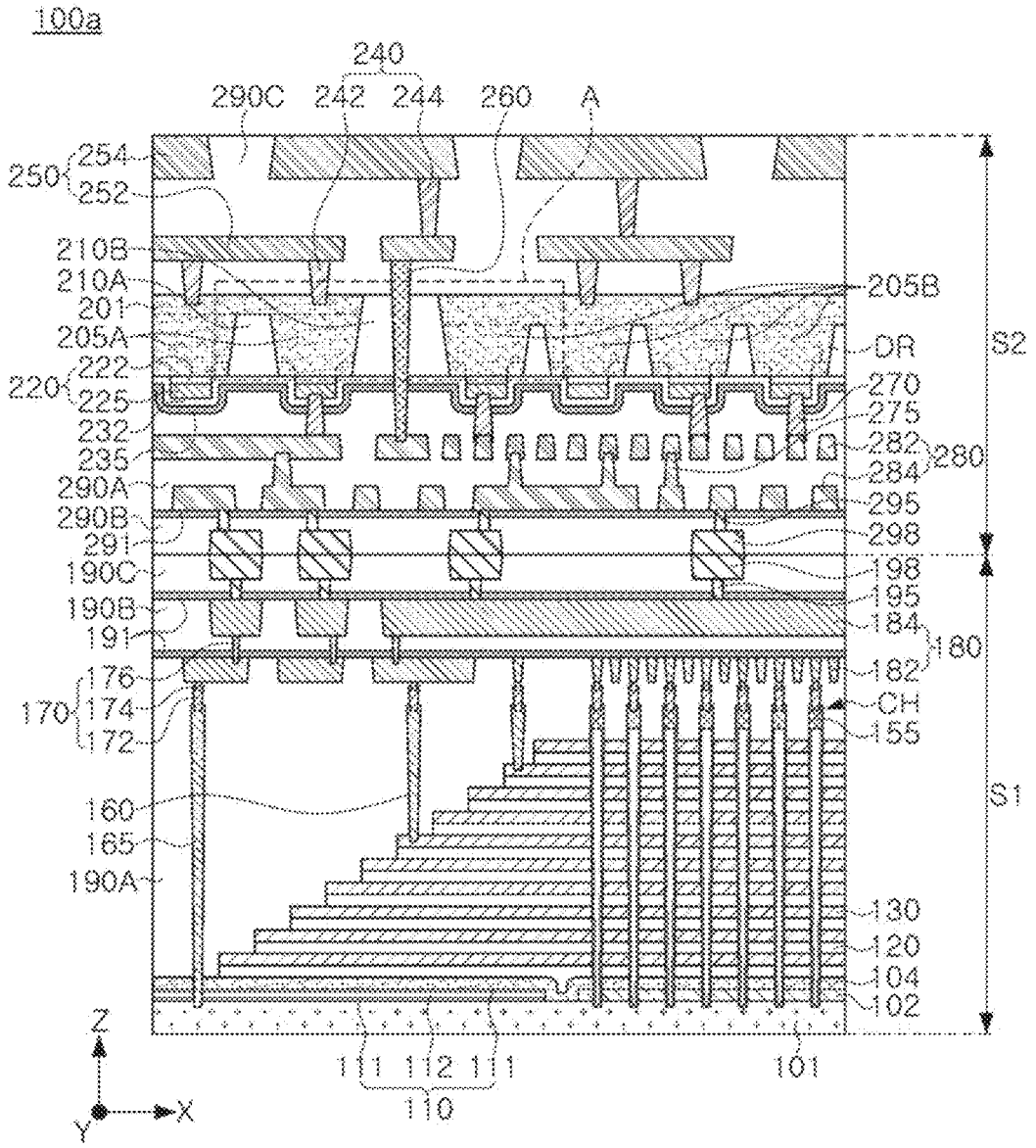
FIGS. 4A and 4B are schematic cross-sectional views and partially enlarged views of a semiconductor device according to some example embodiments.
Figure 4B:
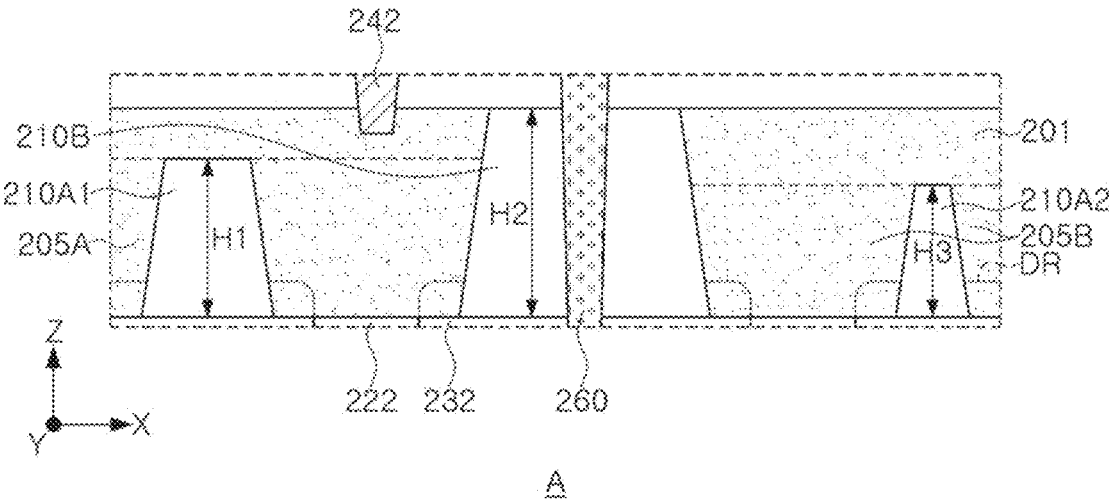

FIGS. 4A and 4B are schematic cross-sectional views and partially enlarged views of a semiconductor device according to some example embodiments. FIG. 4B may be an enlarged view of portion 'A' of FIG. 4A.

Referring to FIGS. 4A and 4B, in a semiconductor device 100a, first device isolation layers 210A1 and 210A2 may have two or more heights. As illustrated in FIG. 4B, first device isolation layers 210A1 between first active regions 205A may have a first height H1, and first device isolation layers 210A2 between second active regions 205B may have a third height H3, smaller than the first height H1. The first height H1 and the third height H3 may be smaller than a second height H2 of a second device isolation layer 210B.

In some example embodiments, the first device isolation layers 210A1 between the first active regions 205A may also have different heights, and the first device isolation layers 210A2 between the second active regions 205B may also have different heights.

Figure 5A:
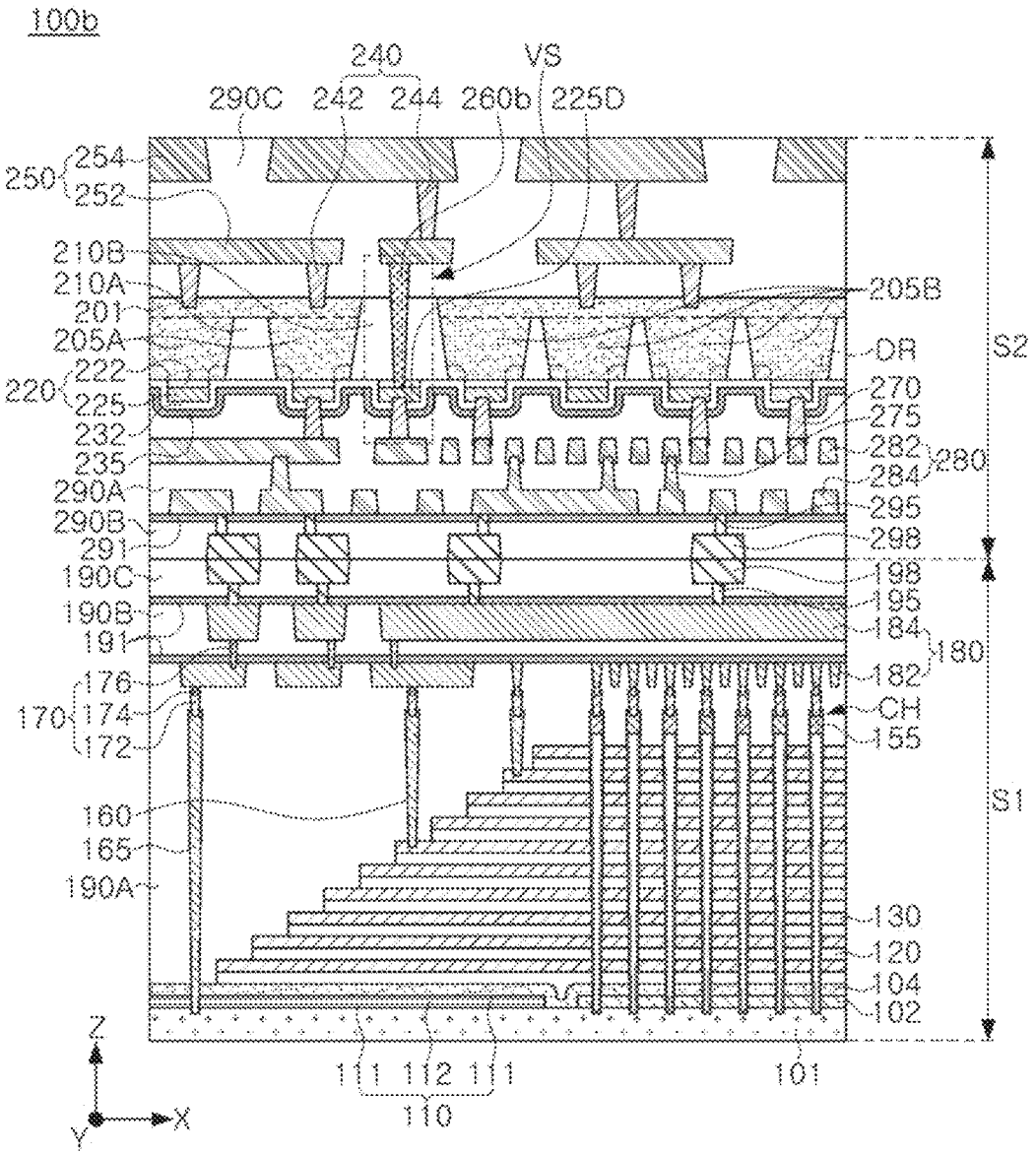
FIGS. 5A and 5B are schematic cross-sectional views of a semiconductor device according to some example embodiments.
Figure 5B:
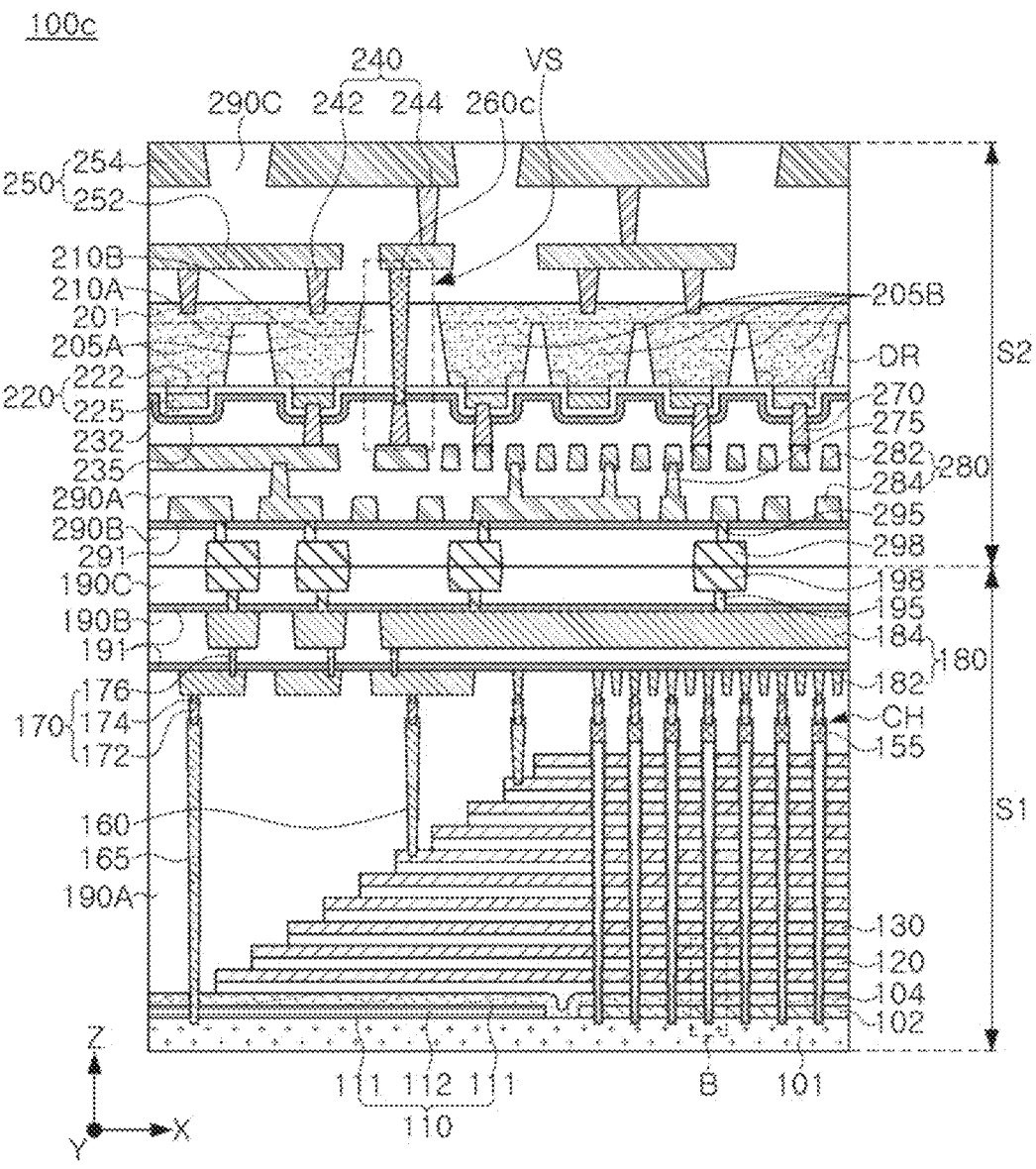

FIGS. 5A and 5B are schematic cross-sectional views of a semiconductor device according to some example embodiments.

Referring to FIG. 5A, in a semiconductor device 100b, a shape of a via 260b may be different from that of some of the example embodiments disclosed in FIG. 1, and a second substrate structure S2 may further include a dummy gate electrode layer 225D.

The via 260*b* may pass through a second device isolation layer 210B and a circuit gate dielectric layer 222 to be connected to the dummy gate electrode layer 225D. The via 260*b* may form a via structure VS connecting a second upper circuit interconnection line 252 and a first lower circuit interconnection line 282, together with the dummy gate electrode layer 225D and a first lower circuit contact plug 270 connected to a lower portion of the dummy gate electrode layer 225D.

Referring to FIG. 5B, in a semiconductor device 100*c*, a shape of a via 260*c* may be different from that of the embodiments of FIGS. 1 and 5A.

The via 260*c* may pass through a second device isolation layer 210B, a gate capping layer 232, and a etch stop layer 235, to be connected to a first lower circuit contact plug 270. The via 260*c* may form a via structure VS connecting a second upper circuit interconnection line 252 and a first lower circuit interconnection line 282, together with the first lower circuit contact plug 270 connected on a lower end.

As in the example embodiments of FIGS. 5A and 5B, lengths of the vias 260*b* and 260*c* and thus the configurations connected on the lower end may be variously changed in some example embodiments.

Figure 6:
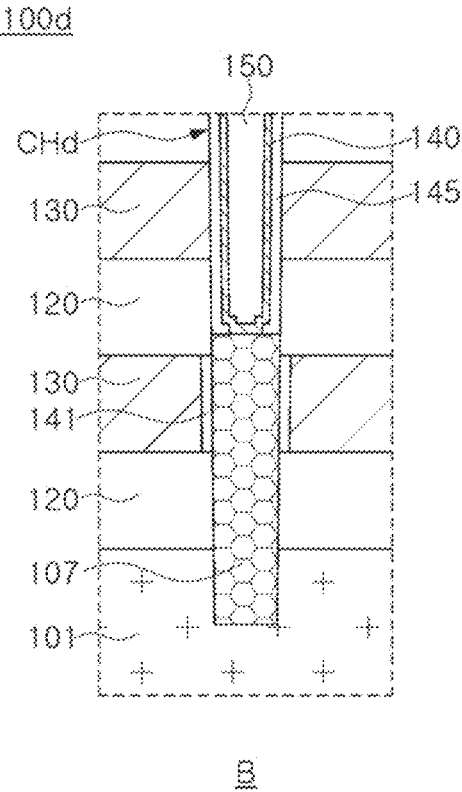
FIG. 6 is a partially enlarged view illustrating a semiconductor device according to some example embodiments.

FIG. 6 is a partially enlarged view illustrating a semiconductor device according to some example embodiments. FIG. 6 illustrates a region corresponding to FIG. 2B.

Referring to FIG. 6, in a semiconductor device 100*d*, a first substrate structure S1 may not include first and second horizontal conductive layers 102 and 104 on a plate layer 101, unlike in some of the example embodiments of FIGS. 1 to 2B. In addition, a channel structure CHd may further include an epitaxial layer 107.

The epitaxial layer 107 may be disposed on the plate layer 101 on a lower end of the channel structure CHd, and may be disposed on a side surface of at least one gate electrode 130. The epitaxial layer 107 may be disposed in a recessed region of the plate layer 101. An upper surface of the epitaxial layer 107 may be located between gate electrodes 130 vertically adjacent to each other. For example, the upper surface of the epitaxial layer 107 may be located higher than an upper surface of a lowermost gate electrode 130, but the present inventive concepts are not limited thereto. The epitaxial layer 107 may be connected to a channel layer 140 through the upper surface. A gate insulating layer 141 may be further disposed between the epitaxial layer 107 and the gate electrode 130 adjacent thereto. Such a shape of the channel structure CHd may be applied to other example embodiments.

FIGS. 7A to 7I are schematic cross-sectional views illustrating a method of manufacturing a semiconductor device according to some example embodiments.

Figure 7A:
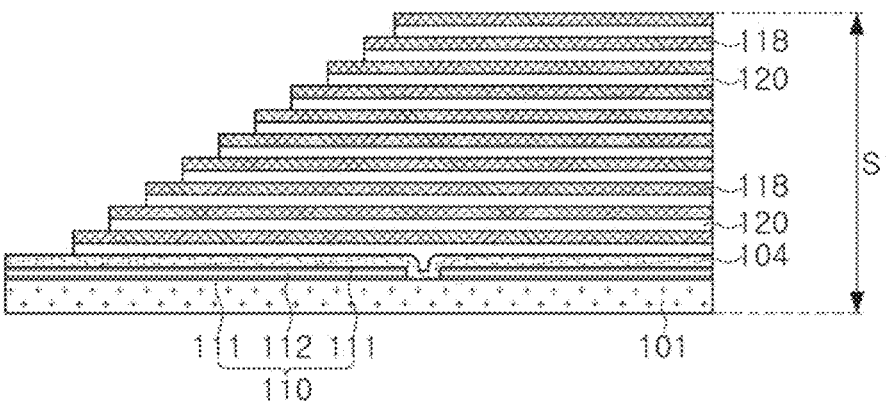

Referring to FIG. 7A, a process of manufacturing a first substrate structure S1 may be started. First, a horizontal insulating layer 110 and a second horizontal conductive layer 104 may be formed on a plate layer 101, and sacrificial insulating layers 118 and interlayer insulating layers 120 may be alternately stacked.

The horizontal insulating layer 110 may be formed by alternately stacking first and second horizontal insulating layers 111 and 112 on the plate layer 101. The horizontal insulating layer 110 may be a layer to be partially replaced with the first horizontal conductive layer 102 of FIG. 1 by a subsequent process. The first horizontal insulating layers 111 may include a material different from that of the second horizontal insulating layer 112. For example, the first horizontal insulating layers 111 may be formed of the same material as the interlayer insulating layers 120, and the second horizontal insulating layer 112 may be formed of the same material as the sacrificial insulating layers 118.

The second horizontal conductive layer 104 may be formed on the horizontal insulating layer 110, and may be in contact with the plate layer 101 in a region from which the horizontal insulating layer 110 is removed.

The sacrificial insulating layers 118 may be a layer to be replaced with gate electrodes 130 (refer to FIG. 1) by a subsequent process. The sacrificial insulating layers 118 may be formed of a material that may be etched with etch selectivity with regard to the interlayer insulating layers 120. For example, the interlayer insulating layer 120 may be formed of at least one of silicon oxide or silicon nitride, and the sacrificial insulating layers 118 may be formed of a material different from that of the interlayer insulating layer 120, selected from silicon, silicon oxide, silicon carbide, and silicon nitride. In some example embodiments, thicknesses of the interlayer insulating layers 120 and the number of layers constituting the interlayer insulating layers 120 may be variously changed from those illustrated. The horizontal insulating layer 110, the second horizontal conductive layer 104, the sacrificial insulating layers 118, and the interlayer insulating layers 120 may be formed using atomic layer deposition (ALD) or chemical vapor deposition (CVD).

In some regions, a photolithography process and an etching process for the sacrificial insulating layers 118 and the interlayer insulating layers 120 may be repeated such that upper sacrificial insulating layers 118 extend less than a lower sacrificial insulating layers 118. Therefore, the sacrificial insulating layers 118 may form a step shape. In some example embodiments, the sacrificial insulating layers 118 may be formed to have a relatively thick thickness in end portions, and a process for this may be further performed.

In some example embodiments, the plate layer 101 may be formed on a separate base substrate. In this case, the base substrate may be removed by a subsequent process, and may be a semiconductor substrate such as silicon (Si), and the plate layer 101 may be formed of, for example, a polycrystalline silicon layer.

Figure 7B:
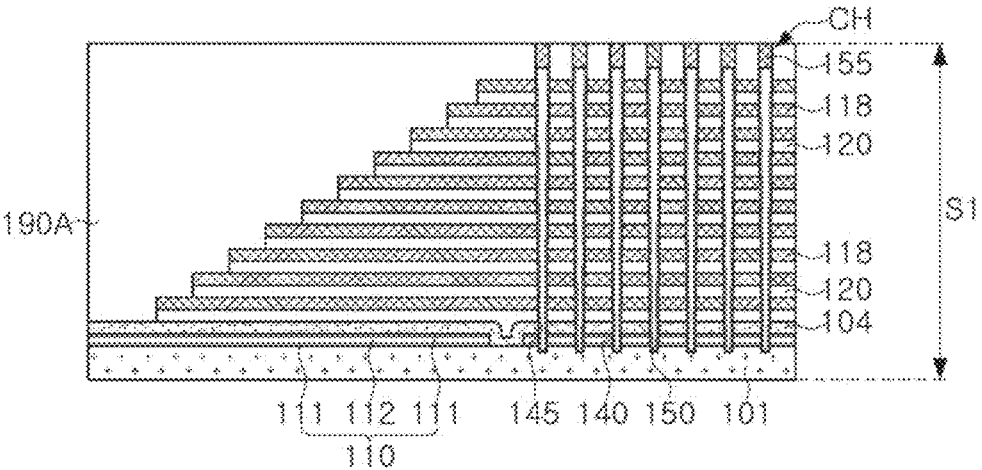

Referring to FIG. 7B, channel structures CH passing through a stack structure of the sacrificial insulating layers 118 and the interlayer insulating layers 120 may be formed.

First, a portion of a first cell region insulating layer 190A covering a stack structure of the sacrificial insulating layers 118 may be formed. Next, channel holes for forming the channel structures CH may be formed. The channel structures CH may be formed by sequentially forming a gate dielectric layer 145, a channel layer 140, a channel buried insulating layer 150, and a channel pad 155 in the channel holes. The channel layer 140 may be formed on the gate dielectric layer 145 in the channel structures CH. The channel buried insulating layer 150 may be formed to fill the channel structures CH, and may be an insulating material. According to some example embodiments, a space between channel layers 140 may be filled with a conductive material, instead of the channel buried insulating layer 150. The channel pad 155 may be formed of a conductive material, for example, polycrystalline silicon.

Figure 7C:
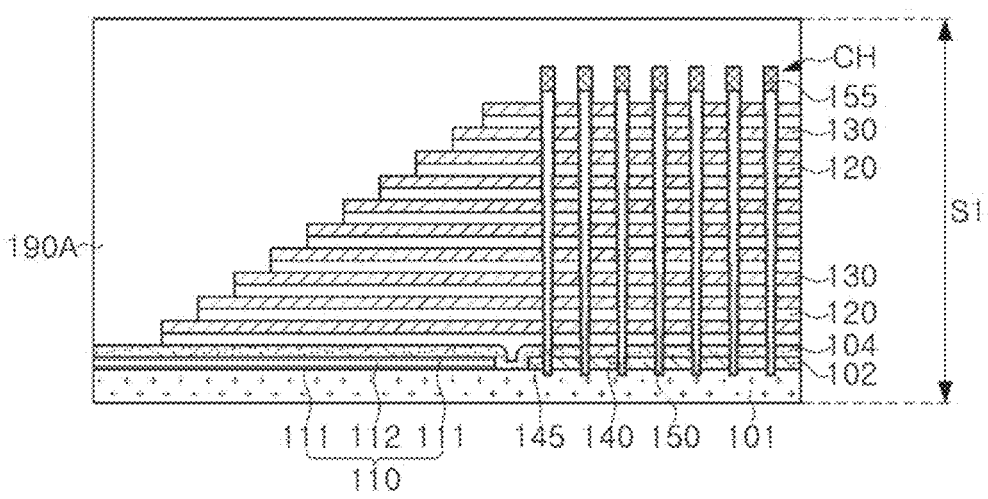

Referring to FIG. 7C, after forming separate openings, a first horizontal conductive layer 102 may be formed, the sacrificial insulating layers 118 may be removed through the openings, and gate electrodes 130 may be formed.

The openings may be formed to pass through the stack structure of the sacrificial insulating layers 118 and to have a trench shape extending in one direction, in a region not illustrated. After forming separate sacrificial spacer layers in the openings, the horizontal insulating layer 110 may be exposed in some regions by an etch-back process. After selectively removing the exposed horizontal insulating layer 110 and depositing a conductive material to form the first horizontal conductive layer 102, the sacrificial spacer layers may be removed from the openings. By this process, the first horizontal conductive layer 102 may be formed in some regions, and the horizontal insulating layer 110 may remain in different regions.

Next, the sacrificial insulating layers 118 may be selectively removed with respect to the interlayer insulating layers 120 using, for example, wet etching. Therefore, tunnel portions may be formed between the interlayer insulating layers 120, and the gate electrodes 130 may be formed by filling the tunnel portions with a conductive material. The gate electrodes 130 may include a metal, polycrystalline silicon, or a metal silicide material. Next, an insulating material may be filled in the openings.

Figure 7D:
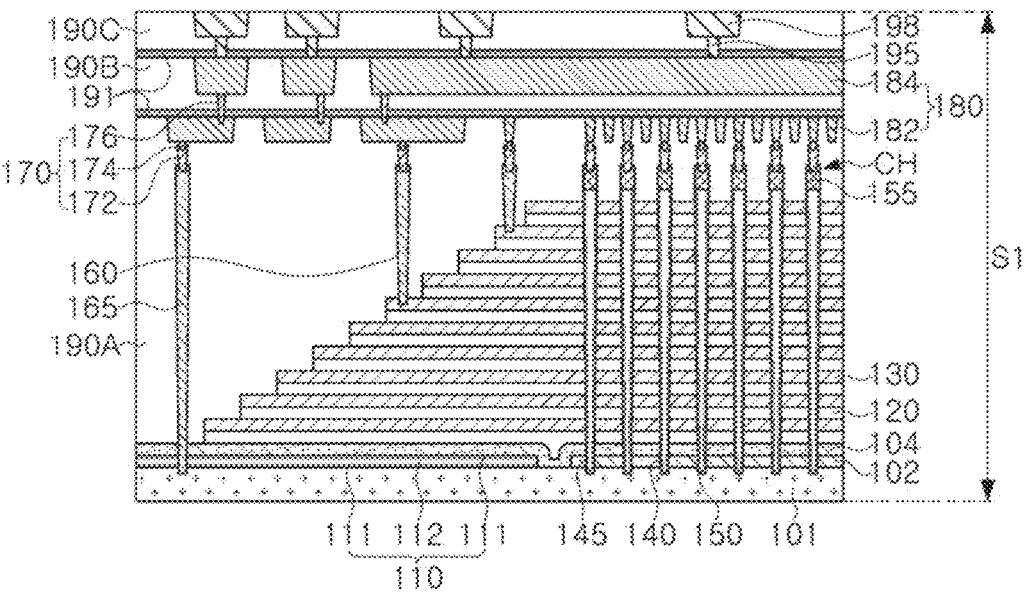

Referring to FIG. 7D, a first interconnection structure, lower protective layers 191, and a first bonding structure may be formed on the gate electrodes 130.

In the first interconnection structure, gate contacts 160 and a substrate contact 165 may be formed by etching the first cell region insulating layer 190A on the gate electrodes 130 and the plate layer 101, to form contact holes, and filling the contact holes with a conductive material. Cell contact plugs 170 may be formed by etching the first cell region insulating layer 190A and depositing a conductive material, on the channel pads 155, the gate contacts 160, and the substrate contact 165. Cell interconnection lines 180 may be formed by a deposition and patterning process of a conductive material, or may be formed by partially forming an insulating layer constituting the first cell region insulating layer 190A, patterning the same, and depositing a conductive material.

The lower protective layers 191 may be formed on the cell interconnection lines 180. A second cell region insulating layer 190B may be formed on a lower protective layer 191 in a lower portion, and a third cell region insulating layer 190C may be formed on a lower protective layer 191 in an upper portion.

First bonding vias 195 and first bonding metal layers 198, constituting the first bonding structure, may be formed by partially removing the third cell region insulating layer 190C. Upper surfaces of the first bonding metal layers 198 may be exposed from the third cell region insulating layer 190C.

By this operation, the first substrate structure S1 may be prepared.

Figure 7E:
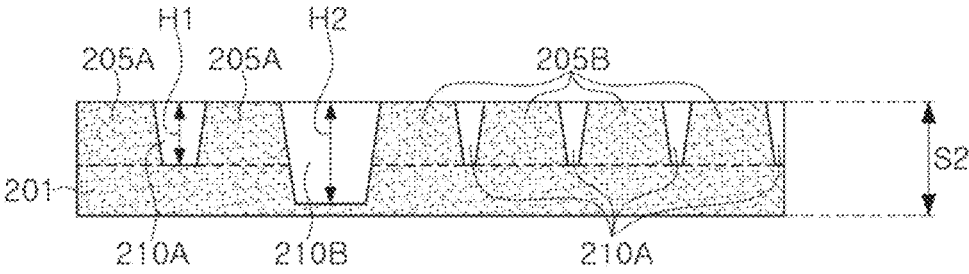

Referring to FIG. 7E, a process of manufacturing a second substrate structure S2 may be started. First, first and second device isolation layers 210A and 210B may be formed on a substrate 201 to define first and second active regions 205A and 205B.

The first and second device isolation layers 210A and 210B may be formed by, for example, an STI process. The first and second device isolation layers 210A and 210B may be formed to have different depths or heights from an upper surface of the substrate 201. The first device isolation layers 210A may have a first height H1, and the second device isolation layers 210B may have a second height H2, greater than the first height H1. The second height H2 may be smaller than a thickness of the substrate 201 in this operation. For example, the first device isolation layers 210A and the second device isolation layer 210B may be formed by different etching processes.

Well regions having a predetermined (or, alternatively, desired) depth may be formed from the upper surface of the substrate 201 including the first and second active regions 205A and 205B. The well regions may be formed before formation of the first and second device isolation layers 210A and 210B, but the present inventive concepts are not limited thereto.

Figure 7F:
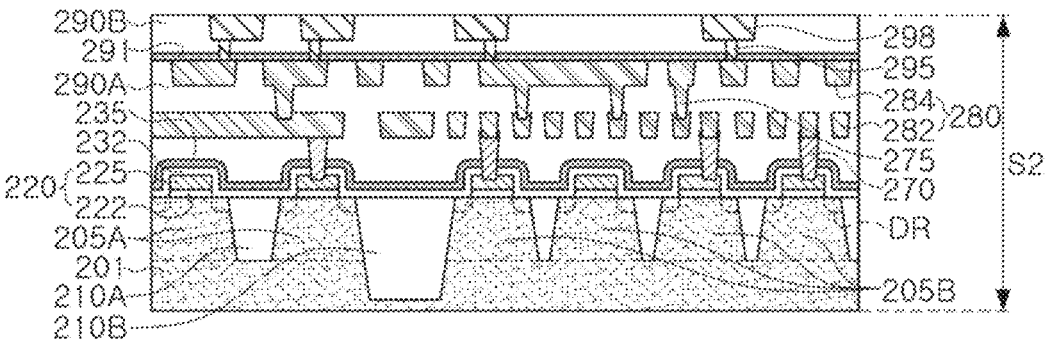

Referring to FIG. 7F, circuit devices 220, a second interconnection structure, and lower protective layers 291 may be formed on the substrate 201.

For example, a circuit gate dielectric layer 222 may be formed of silicon oxide, and a circuit gate electrode layer 225 may be formed as at least one of polycrystalline silicon or a metal silicide layer, but the present inventive concepts are not limited thereto. Source/drain regions DR may be formed in the first and second active regions 205A and 205B on both sides of the circuit devices 220 by performing an ion implantation process.

A gate capping layer 232 including spacer layers and an insulating layer may be formed by forming the spacer layers on both sidewalls of the circuit devices 220, and forming the insulating layer covering the spacer layers and the circuit devices 220 and extending onto the substrate 201. An etch stop layer 235 may be formed on the gate capping layer 232.

Circuit contact plugs 270 of the second interconnection structure and second bonding vias 295 of a second bonding structure may be formed by partially forming first and second peripheral region insulating layers 290A and 290B, etching and removing a portion, and burying a conductive material. Circuit interconnection lines 280 of the second interconnection structure and second bonding metal layers 298 of the second bonding structure may be formed, for example, by depositing a conductive material and then patterning the same. The second bonding metal layers 298 may be formed such that upper surfaces thereof are exposed through the second peripheral region insulating layer 290B. The upper surface of the second bonding metal layers 298 may form a portion of an upper surface of the second substrate structure S2.

The first peripheral region insulating layer 290A may be formed on the gate capping layer 232, and a second peripheral region insulating layer 290B may be formed on the upper protective layers 291. Each of the first and second peripheral region insulating layers 290A and 290B may include a plurality of insulating layers. The first and second peripheral region insulating layers 290A and 290B may be partially formed in respective operations of forming the second interconnection structure and the second bonding structure.

The upper protective layers 291 may be formed on second circuit interconnection lines 284.

Figure 7G:
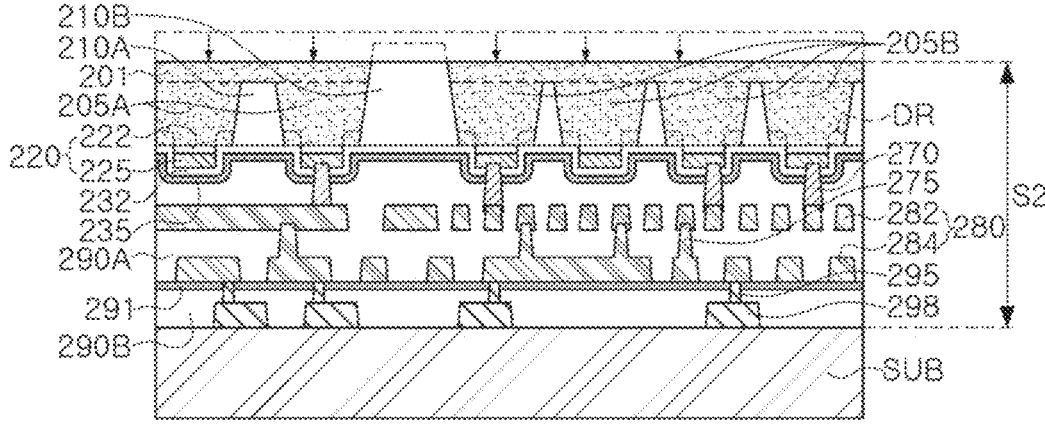

Referring to FIG. 7G, the substrate 201 may be partially removed by attaching a carrier substrate SUB on the second bonding metal layers 298 and turning over the second substrate structure S2 that is being manufactured.

The carrier substrate SUB may be attached on the second bonding metal layers 298 and the second peripheral region insulating layer 290B, to perform a process on a lower surface of the substrate 201 of FIG. 7F. In FIG. 7G, for better understanding, the second substrate structure S2 is illustrated as being rotated or reversed to have a mirror image of the structure illustrated in FIG. 7F.

The substrate 201 may be removed to have a predetermined (or, alternatively, desired) thickness from the upper surface of the substrate 201. The substrate 201 may be completely removed on the second device isolation layer 210B. Therefore, the first active regions 205A and the second active regions 205B each have an island shape and may be completely separated from each other by the second device isolation layer 210B. The substrate 201 may be removed by, for example, a lapping process, a grinding process, or a polishing process.

Figure 7H:
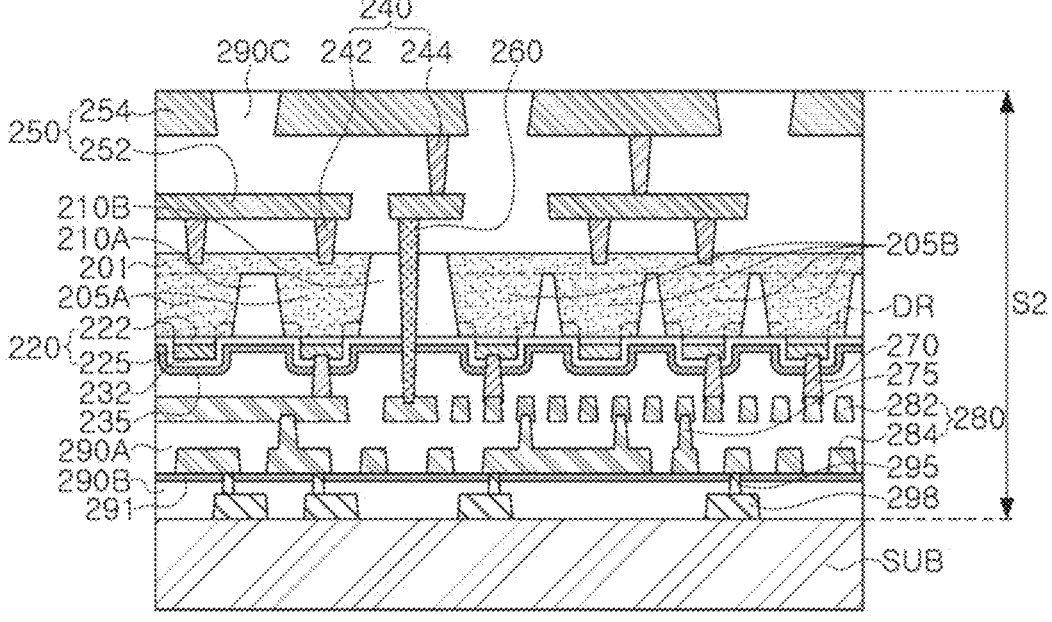
Figure 71:
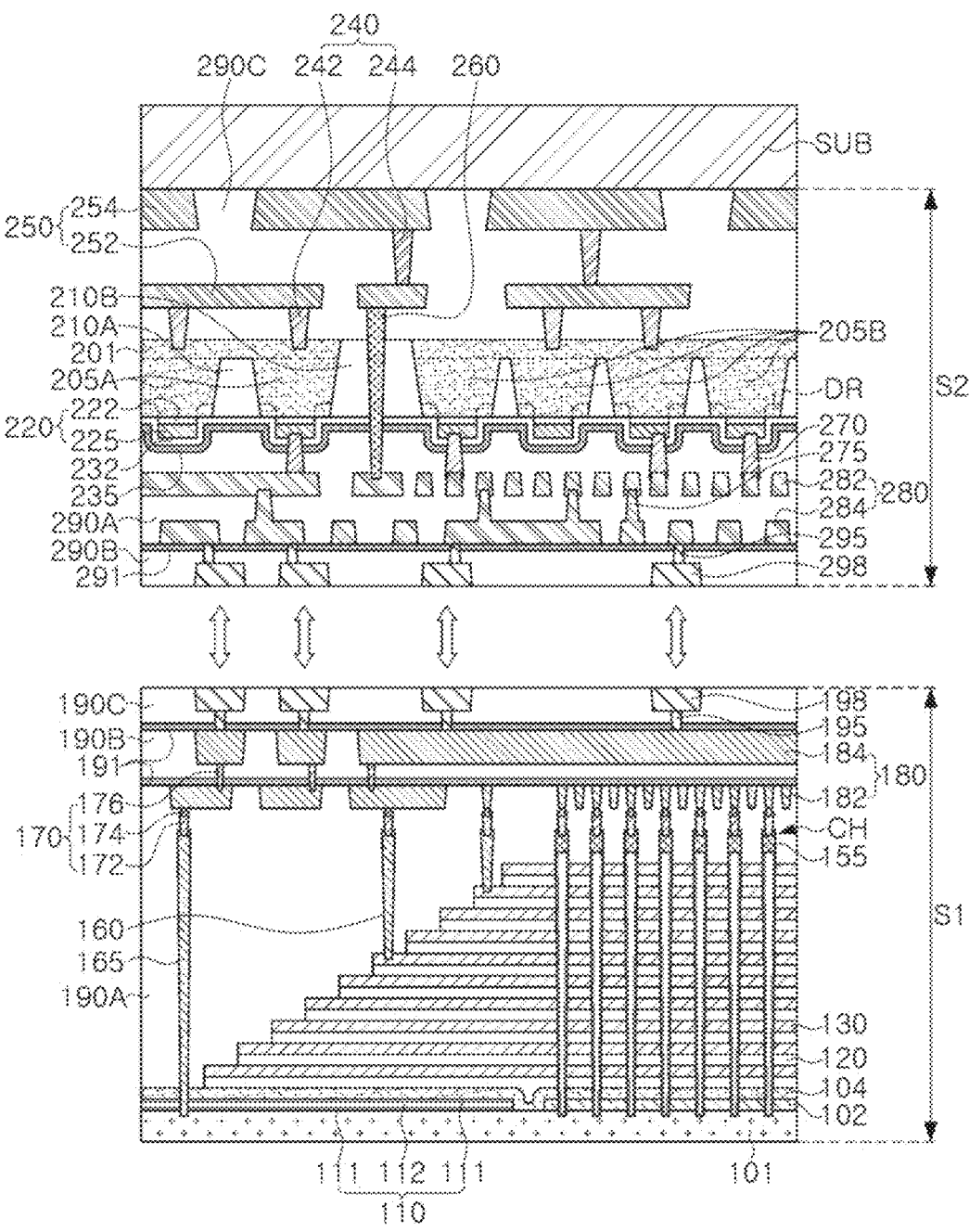

Referring to FIG. 7H, a third interconnection structure may be formed on the substrate 201.

Upper circuit contact plugs 240, first upper circuit interconnection lines 252, and a via 260 of the third interconnection structure may be formed by partially forming a third peripheral region insulating layer 290C, etching a portion thereof to remove the same, and burying a conductive material. The via 260 may be formed together with the first upper circuit contact plugs 242 in the same process, but the present inventive concepts are not limited thereto. Second upper circuit interconnection lines 254 of the third interconnection structure may be formed by, for example, depositing a conductive material and then patterning the same.

The third peripheral region insulating layer 290C may be formed on the upper surface of the substrate 201, and may be formed as a plurality of insulating layers. A portion of the third peripheral region insulating layer 290C may be formed in respective operations of forming the third interconnection structure.

By this operation, the second substrate structure S2 may be prepared.

Referring to FIG. 7I, the first substrate structure S1 and the second substrate structure S2 may be bonded.

The first substrate structure S1 and the second substrate structure S2 may be connected by bonding the first bonding metal layers 198 and the second bonding metal layers 298 by annealing and/or pressing. At the same time, bonding insulating layers that may be a portion of the third cell region insulating layer 190C and a portion of the second peripheral region insulating layer 290B may be bonded. After the second substrate structure S2 is turned over on the first substrate structure S1 such that the second bonding metal layers 298 face in a downward direction, bonding may be performed. In the drawings, for better understanding, it is illustrated that the second substrate structure S2 is bonded to have a mirror image of the structure illustrated in FIG. 7H.

The first substrate structure S1 and the second substrate structure S2 may be directly bonded without intervening of an adhesive such as a separate adhesive layer. According to some example embodiments, before bonding, a surface treatment process such as hydrogen plasma treatment may be further performed on an upper surface of the first substrate structure S1 and a lower surface of the second substrate structure S2, to enhance bonding strength.

Next, referring to FIG. 1, the carrier substrate SUB may be removed from a bonding structure of the first and second substrate structures S1 and S2. Therefore, the semiconductor device 100 of FIG. 1 may be finally (e.g., fully) manufactured. In some example embodiments, a passivation layer (not shown) may be further formed on an upper surface of the third peripheral region insulating layer 290C.

Figure 8A:
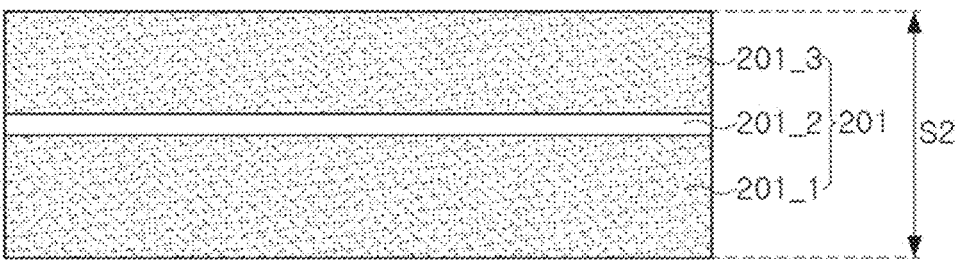
FIGS. 8A and 8B are schematic cross-sectional views illustrating a method of manufacturing a semiconductor device according to some example embodiments.
Figure 8B:
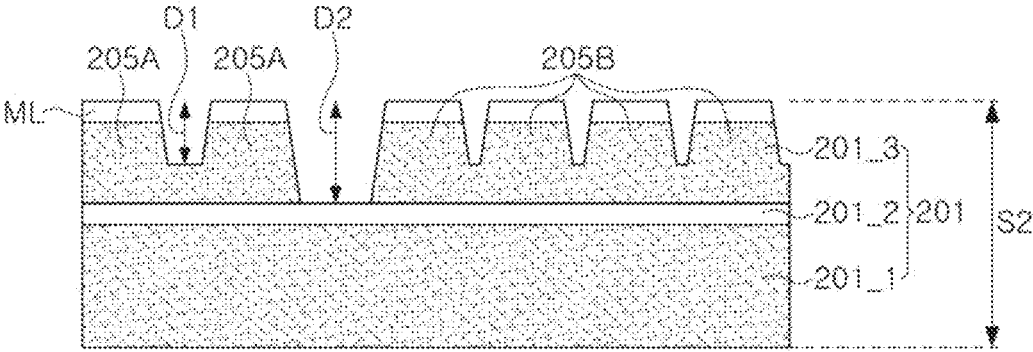

FIGS. 8A and 8B are schematic cross-sectional views illustrating a method of manufacturing a semiconductor device according to some example embodiments.

Referring to FIG. 8A, a substrate 201 of a second substrate structure S2 may be prepared. The substrate 201 of some example embodiments may have a structure different from that of the embodiment of FIG. 7E. The substrate 201 may include a lower semiconductor layer 201_1, a buried insulating layer 201_2, and an upper semiconductor layer 201_3. The substrate 201 may be, for example, a silicon-on-insulator (SOI) substrate or a semiconductor-on-insulator (SeOI) substrate.

Referring to FIG. 8B, trenches for forming first and second device isolation layers 210A and 210B (see FIG. 2) may be formed in the substrate 201, to define first and second active regions 205A and 205B.

As in the process described above with reference to FIG. 7E, the upper semiconductor layer 201_3 may be etched using a mask layer ML, to form trenches in regions in which the first and second device isolation layers 210A and 210B are formed. The trenches may be formed to have different depths D1 and D2 or different heights, from the upper surface of the substrate 201. The trenches between the first active regions 205A may be formed to have a first depth D1, and the trench between the first active regions 205A and the second active regions 205B may be formed to have a second depth D2, deeper than the first depth D1. The second depth D2 may be equal to or greater than a thickness of the upper semiconductor layer 201_3. Therefore, the buried insulating layer 201_2 may be exposed from a bottom surface of the trench between the first active regions 205A and the second active regions 205B.

Next, first and second device isolation layers 210A and 210B may be formed by filling the trenches with an insulating material, as described above with reference to FIG. 7E, and a second interconnection structure and a second bonding structure may be formed, as described above with reference to FIG. 7F.

Next, the lower semiconductor layer 201_1 may be separated using, for example, a lift-off process using a laser. The buried insulating layer 201_2 may be separated together with the lower semiconductor layer 201_1, or may be removed by a separate process. Therefore, the remaining upper semiconductor layer 201_3 may form the substrate 201.

Next, a third interconnection structure may be formed, as described above with reference to FIG. 7H, and subsequent processes may be performed in the same manner, to manufacture the semiconductor device 100 of FIG. 1.

Figure 9:
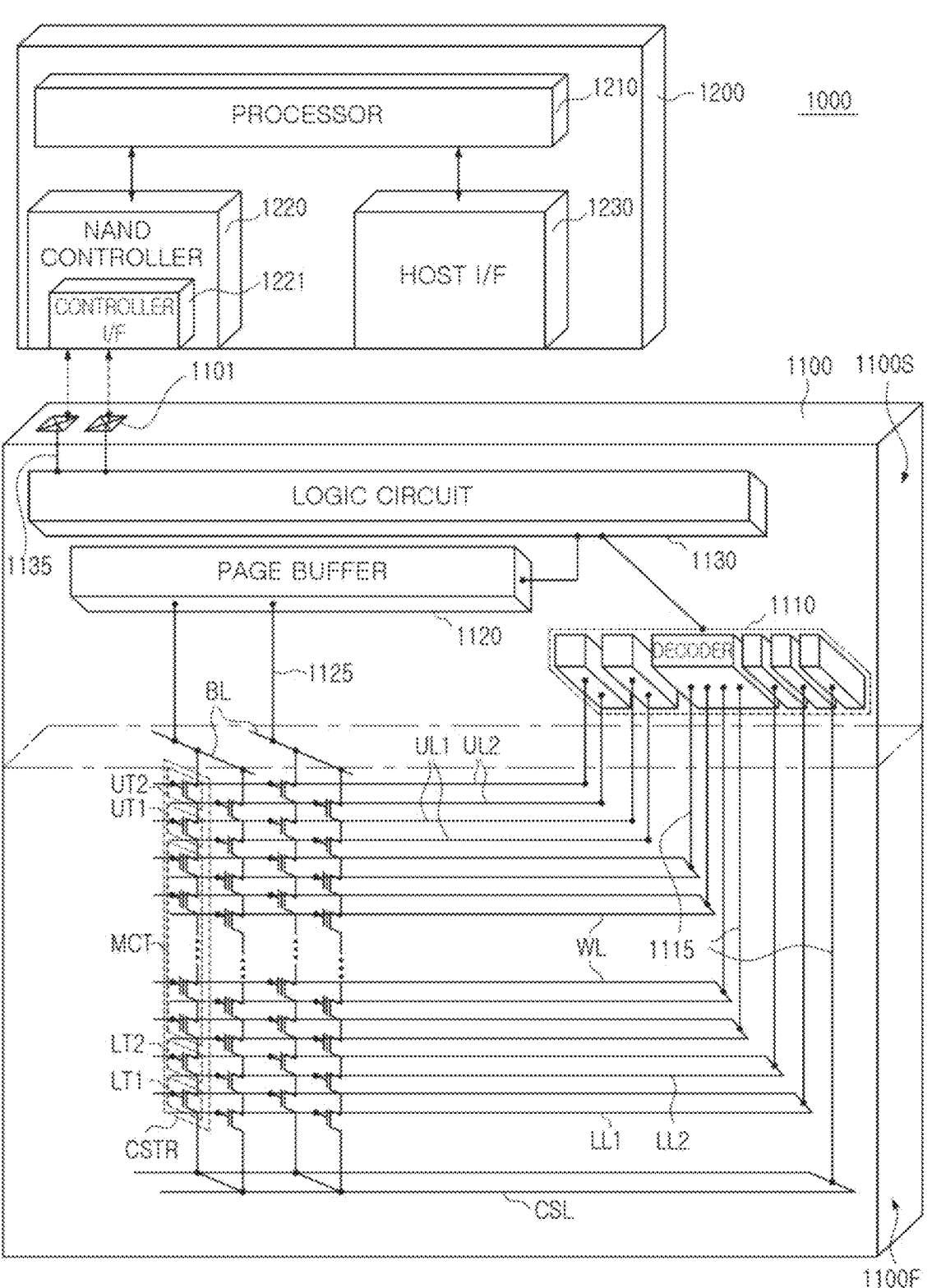
FIG. 9 is a view schematically illustrating a data storage system including a semiconductor device according to some example embodiments.

FIG. 9 is a view schematically illustrating a data storage system including a semiconductor device according to some example embodiments.

Referring to FIG. 9, a data storage system 1000 may include a semiconductor device 1100, and a controller 1200 electrically connected to the semiconductor device 1100. The data storage system 1000 may be a storage device including the semiconductor device 1100 as a single semiconductor device or a plurality of semiconductor devices, or an electronic device including the storage device. For example, the data storage system 1000 may be a solid state drive device (SSD), a universal serial bus (USB), a computing system, a medical device, or a communication device, including the semiconductor device 1100 as a single semiconductor device or a plurality of semiconductor devices.

The semiconductor device 1100 may be a non-volatile memory device, for example, a NAND flash memory device according to any one of the embodiments described above with reference to FIGS. 1 to 6. The semiconductor device 1100 may include a first structure 1100F, and a second structure 1100S on the first structure 1100F. In some example embodiments, the first structure 1100F may be disposed next to the second structure 1100S. The first structure 1100F may be a memory cell structure including bit lines BL, a common source line CSL, word lines WL, first and second upper gate lines UL1 and UL2, first and second lower gate lines LL1 and LL2, and memory cell strings CSTR between each of the bit lines BL and the common source line CSL. The second structure 1100S may be a peripheral circuit structure including a decoder circuit 1110, a page buffer 1120, and a logic circuit 1130.

In the first structure 1100F, each of the memory cell strings CSTR may include lower transistors LT1 and LT2 adjacent to the common source line CSL, upper transistors UT1 and UT2 adjacent to each of the bit lines BL, and a plurality of memory cell transistors MCT disposed between each of the lower transistors LT1 and LT2 and each of the upper transistors UT1 and UT2. The number of lower transistors LT1 and LT2 and the number of upper transistors UT1 and UT2 may be variously changed according to some example embodiments.

In some example embodiments, each of the upper transistors UT1 and UT2 may include a string select transistor, and each of the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In some example embodiments, the lower transistors LT1 and LT2 may include a lower erase control transistor LT1 and a ground select transistor LT2, connected in series. The upper transistors UT1 and UT2 may include a string select transistor UT1 and an upper erase control transistor UT2, connected in series. At least one of the lower erase control transistor LT1 or the upper erase control transistor UT2 may be used for an erase operation of erasing data stored in the memory cell transistors MCT using a gate-induced-drain-leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection interconnections 1115 extending from the first structure 1100F into the second structure 1100S. The bit lines BL may be electrically connected to the page buffer 1120 through second connection interconnections 1125 extending from the first structure 1100F into the second structure 1100S.

In the second structure 1100S, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through input/output connection interconnections 1135.

The controller 1200 may include a processor 1210, a NAND controller 1220, and a host interface 1230. According to some example embodiments, the data storage system 1000 may include a plurality of semiconductor devices 1100, and in this case, the controller 1200 may control the plurality of semiconductor devices 1100.

The processor 1210 may control an overall operation of the data storage system 1000 including the controller 1200. The processor 1210 may operate according to predetermined (or, alternatively, desired) firmware, and may access to the semiconductor device 1100 by controlling the NAND controller 1220. The NAND controller 1220 may include a controller interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, or the like may be transmitted through the controller interface 1221. The host interface 1230 may provide a communication function between the data storage system 1000 and an external host. When a control command is received from the external host through the host interface 1230, the processor 1210 may control the semiconductor device 1100 in response to the control command.

Figure 10:
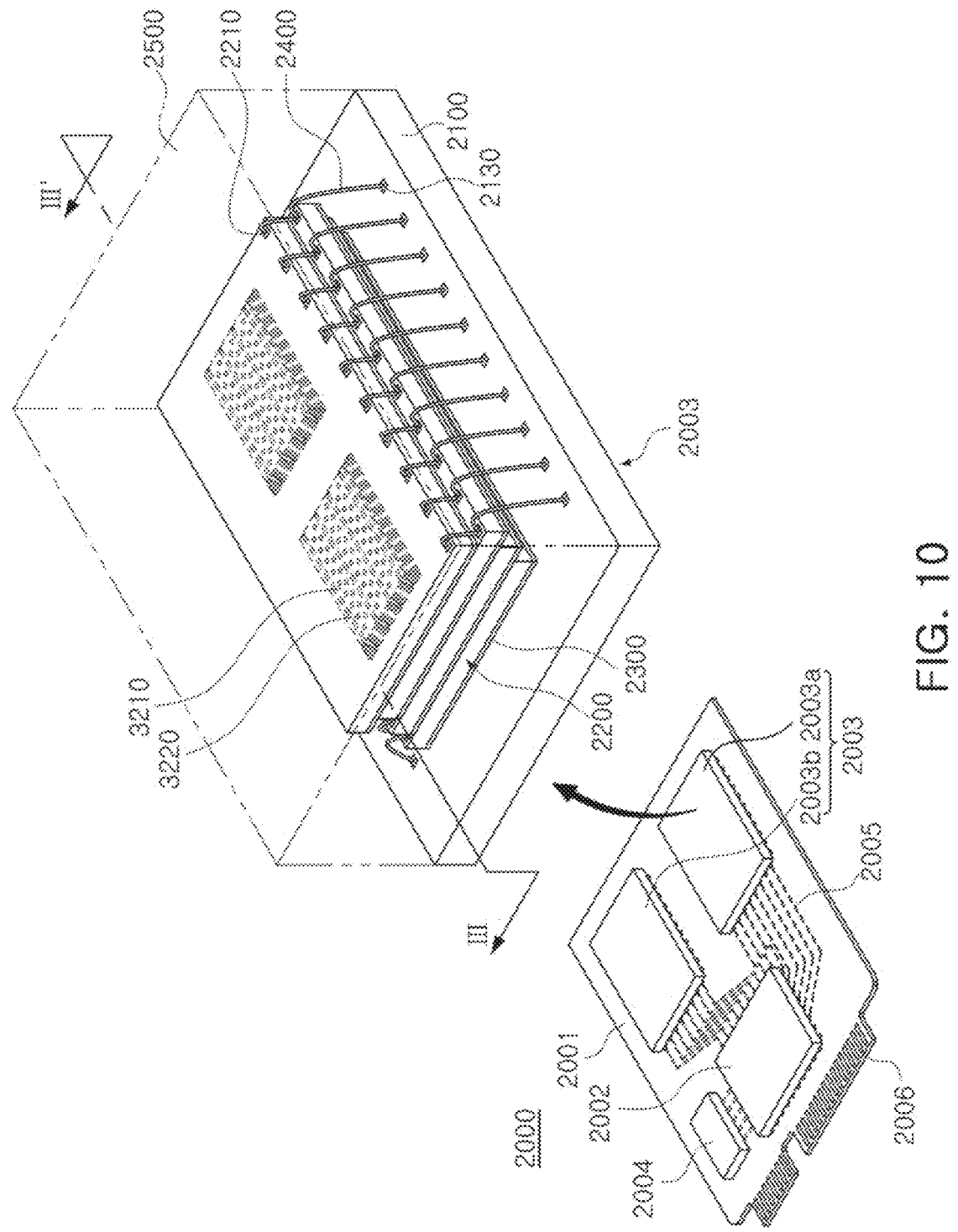
FIG. 10 is a schematic perspective view of a data storage system including a semiconductor device according to some example embodiments.

FIG. 10 is a perspective view schematically illustrating a data storage system including a semiconductor device according to some example embodiments.

Referring to FIG. 10, a data storage system 2000 according to some example embodiments of the present inventive concepts may include a main substrate 2001, a controller 2002 mounted on the main substrate 2001, at least one semiconductor package 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins, which may be coupled to an external host. The number and an arrangement of the plurality of pins in the connector 2006 may vary according to a communication interface between the data storage system 2000 and the external host. In some example embodiments, the data storage system 2000 may be communicated with the external host according to any one interface of a universal serial bus (USB), peripheral component interconnect express (PCI-Express), serial advanced technology attachment (SATA), M-Phy for universal flash storage (UFS), or the like. In some example embodiments, the data storage system 2000 may be operated by power supplied from the external host through the connector 2006. The data storage system 2000 may further include a power management integrated circuit (PMIC) distributing power supplied from the external host to the controller 2002 and the semiconductor package 2003.

The controller 2002 may write data to the semiconductor package 2003 or read data from the semiconductor package 2003, and may improve an operation speed of the data storage system 2000.

The DRAM 2004 may be a buffer memory reducing a difference in speed between the semiconductor package 2003, which may be a data storage space, and the external host. The DRAM 2004 included in the data storage system 2000 may also operate as a type of cache memory, and may provide a space temporarily storing data in a control operation on the semiconductor package 2003. When the DRAM 2004 is included in the data storage system 2000, the controller 2002 may further include a DRAM controller controlling the DRAM 2004, in addition to a NAND controller controlling the semiconductor package 2003.

The semiconductor package 2003 may include first and second semiconductor packages 2003*a* and 2003*b*, spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, semiconductor chips 2200 on the package substrate 2100, adhesive layers 2300 disposed on a lower surface of each of the semiconductor chips 2200, a connection structure 2400 electrically connecting each of the semiconductor chips 2200 and the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an input/output pad 2210. Each of the semiconductor chips 2200 may include gate stack structures 3210 and channel structures 3220. Each of the semiconductor chips 2200 may include the semiconductor device described above with reference to FIGS. 1 to 6.

In some example embodiments, the connection structure 2400 may be a bonding wire electrically connecting the input/output pad 2210 and the upper package pads 2130. Therefore, in each of the first and second semiconductor packages 2003a and 2003b, the semiconductor chips 2200 may be electrically connected to each other by a bonding wire process, and may be electrically connected to the package upper pads 2130 of the package substrate 2100. According to some example embodiments, in each of the first and second semiconductor packages 2003a and 2003b, the semiconductor chips 2200 may be electrically connected to each other by a connection structure including a through silicon via (TSV), instead of a connection structure 2400 by a bonding wire process.

In some example embodiments, the controller 2002 and the semiconductor chips 2200 may be included in one (1) package. In some example embodiments, the controller 2002 and the semiconductor chips 2200 may be mounted on a separate interposer substrate, different from the main substrate 2001, and the controller 2002 and the semiconductor chips 2200 may be connected to each other by a wiring formed on the interposer substrate.

Figure 11:
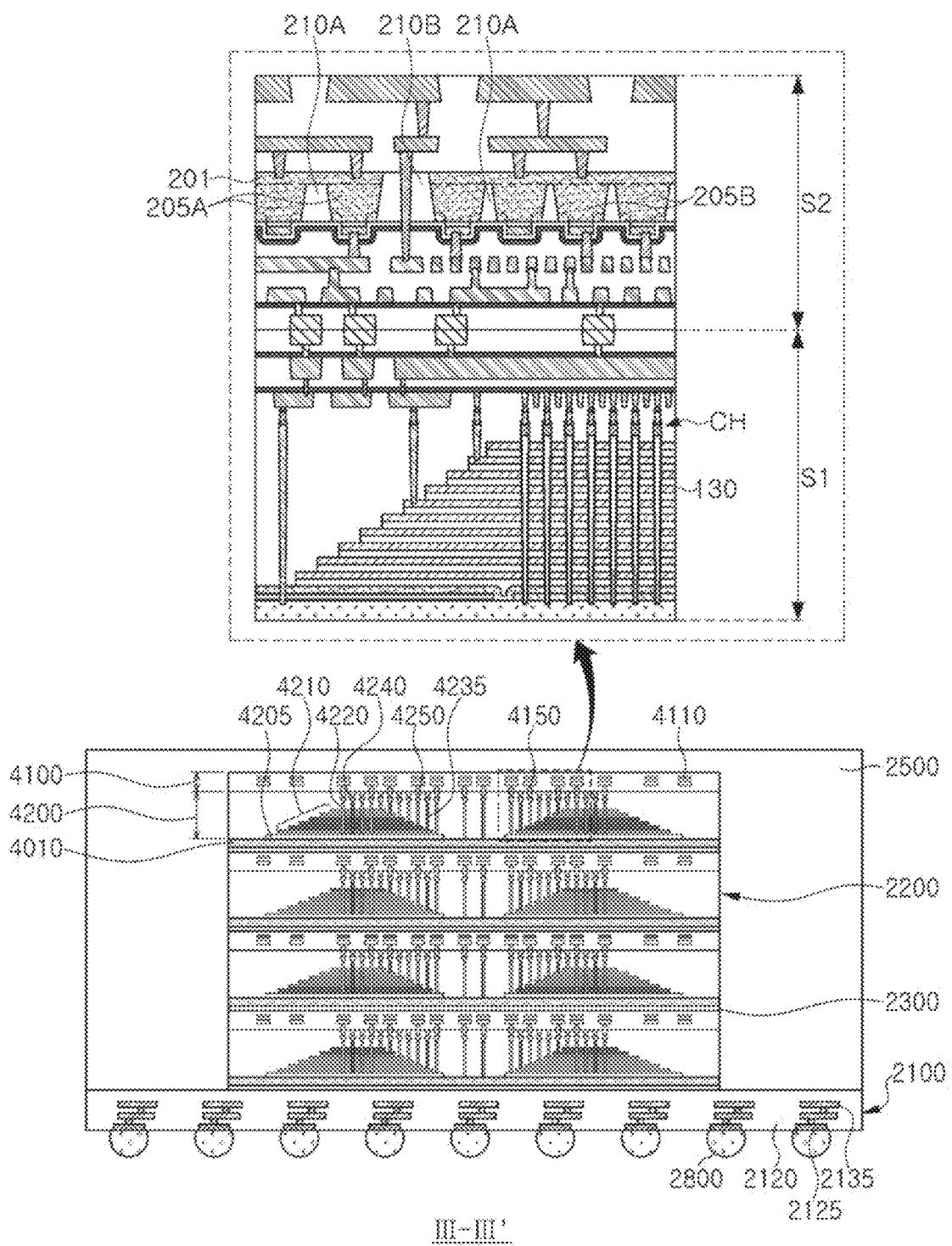
FIG. 11 is a cross-sectional view schematically illustrating a semiconductor package according to some example embodiments.

FIG. 11 is a cross-sectional view schematically illustrating a semiconductor package according to some example embodiments. FIG. 11 illustrates some example embodiments of the semiconductor package 2003 of FIG. 10, and conceptually illustrates a region taken along line III-III' of the semiconductor package 2003 of FIG. 10.

Referring to FIG. 11, in a semiconductor package 2003A, semiconductor chips 2200b may include a semiconductor substrate 4010, a first structure 4200 on the semiconductor substrate 4010, and a second structure 4100 bonded to the first structure 4200 in a wafer bonding method on the first structure 4200, respectively.

The first structure 4200 may include a common source line 4205, a gate stack structure 4210 between the common source line 4205 and the second structure 4200, memory channel structures 4220 passing through the gate stack structure 4210, and first bonding structures 4250 electrically connected to word lines WL (refer to FIG. 9) of the memory channel structures 4220 and the gate stack structure 4210, respectively. For example, the first bonding structures 4250 may be electrically connected to the memory channel structures 4220 and the word lines WL (refer to FIG. 9), respectively, through bit lines 4240 electrically connected to the memory channel structures 4220 and through gate contacts 4235 electrically connected to the word lines WL (refer to FIG. 9). First bonding structures 4250 of the first structure 4200 and second bonding structures 4150 of the second structure 4100 may be bonded while contacting each other. Bonded portions of the second bonding structures 4150 and the first bonding structures 4250 may be formed of, for example, copper (Cu). The second structure 4100 may include a peripheral circuit region including a peripheral interconnection 4110 and the second bonding structures 4150.

As illustrated in the enlarged view, the second structure 4100 may include first and second device isolation layers 210A and 210B disposed on different heights in a substrate 201. First active regions 205A and second active regions 205B may be completely separated by the second device isolation layer 210B.

The semiconductor chips 2200 may be electrically connected to each other by connection structures 2400 (refer to FIG. 10) in the form of bonding wires. In some example embodiments, semiconductor chips in one (1) semiconductor package such as the semiconductor chips 2200 may be electrically connected to each other by a connection structure including a through electrode TSV.

Device isolation layers having different heights may be disposed in a structure in which two or more substrate structures are bonded, to provide semiconductor devices with an improved degree of integration and data storage systems including the same.

The data storage system 1000 (or other circuitry, for example, the semiconductor device 1100, logic circuit 1130, page buffer 1120, decoder circuit 1110, controller 1200, processor 1210, NAND controller 1220, host interface 1230, controller interface 1221, etc.) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Various advantages and effects of the present inventive concepts are not limited to the above, and will be more easily understood in the process of describing various example embodiments of the present inventive concepts.

While some example embodiments have been illustrated and described above, it will be apparent to those skilled in the art that modifications, variations, and combinations of the example embodiments could be made without departing from the scope of the present inventive concepts as defined by the appended claims.

What is claimed is:

1. A semiconductor device comprising:
a first substrate structure including
    a plate layer,
    gate electrodes spaced apart from each other and stacked on the plate layer in a first direction, perpendicular to an upper surface of the plate layer,
    channel structures penetrating through the gate electrodes, extending in the first direction, and each of the channel structures respectively including a channel layer,
    a first interconnection structure on the gate electrodes and electrically connected to the gate electrodes and the channel structures, and
    first bonding metal layers on the first interconnection structure; and
a second substrate structure connected to the first substrate structure on the first substrate structure, the second substrate structure including
    a substrate having active regions,
    device isolation layers in the substrate defining the active regions,
    circuit devices on a lower surface of the substrate,
    a second interconnection structure below the circuit devices and electrically connected to the circuit devices,
    a third interconnection structure on the substrate, and second bonding metal layers below the second interconnection structure and connected to the first bonding metal layers, the device isolation layers including first device isolation layers having a first height in the first direction, and a second device isolation layer penetrating entirely through the substrate in the first direction and having a second height, greater than the first height, the active regions including first active regions spaced apart by the first device isolation layers and connected to each other by the substrate, and a second active region separated from the first active regions by the second device isolation layer, the third interconnection structure including upper contact plugs connected to an upper portion of the substrate, and a via penetrating through the second device isolation layer and electrically connected to the second interconnection structure.

2. The semiconductor device of claim 1, wherein the first active regions are surrounded by the second device isolation layer in a plan view.

3. The semiconductor device of claim 1, wherein the substrate has a thickness corresponding to the second height in the first direction.

4. The semiconductor device of claim 1, wherein the first active regions are configured to receive a common electrical signal through the upper contact plugs.

5. The semiconductor device of claim 1, wherein the substrate extends onto upper surfaces of the first active regions and onto upper surfaces of the first device isolation layers.

6. The semiconductor device of claim 1, wherein, in a second direction, perpendicular to the first direction, a width of the second device isolation layer is about 30 nm to about 300 nm.

7. The semiconductor device of claim 1, wherein the first active regions include first conductivity-type impurities, and the second active region includes second conductivity-type impurities.

8. The semiconductor device of claim 1, wherein, in each of the device isolation layers, a width of an upper surface of the device isolation layer is narrower than a width of a lower surface of the device isolation layer.

9. The semiconductor device of claim 1, wherein
in each of the upper contact plugs, a width of an upper surface of the upper contact plug is wider than a width of a lower surface of the upper contact plug, and
a width of an upper surface of the via is wider than a width of a lower surface of the via.

10. The semiconductor device of claim 1, wherein
the third interconnection structure further includes interconnection lines on the upper contact plugs and the via, and
the via directly connects one of the interconnection lines to the second interconnection structure.

11. The semiconductor device of claim 1, wherein
each of the circuit devices includes a circuit gate dielectric layer on the lower surface of the substrate and a circuit gate electrode layer on a lower surface of the circuit gate dielectric layer, and
the second substrate structure further includes a dummy gate electrode layer on the same level as the circuit gate electrode layer and connected to the via.

12. The semiconductor device of claim 1, wherein the second interconnection structure comprises lower contact plugs extending in the first direction and respectively connected to the circuit devices and the via.

13. The semiconductor device of claim 1, wherein the first substrate structure further comprises:
a first horizontal conductive layer between the plate layer and the gate electrodes and contacting the channel layer of each of the channel structures; and
a second horizontal conductive layer on the first horizontal conductive layer.

14. A semiconductor device comprising:
a first substrate structure including
a plate layer,
gate electrodes spaced apart from each other and stacked on the plate layer in a first direction, perpendicular to an upper surface of the plate layer,
channel structures penetrating through the gate electrodes, extending in the first direction, and each of the channel structures respectively including a channel layer, and
first bonding metal layers on the channel structures; and
a second substrate structure connected to the first substrate structure, the second substrate structure including
a substrate having active regions,
device isolation layers in the substrate defining the active regions,
circuit devices on one surface of the substrate, and
second bonding metal layers connected to the first bonding metal layers,
the device isolation layers including first device isolation layers and a second device isolation layer having different heights, wherein the second device isolation layer comprises one or more insulating materials filling a width of a trench in the substrate, and
the active regions including first active regions spaced apart by the first device isolation layers and connected to each other by the substrate, and second active regions separated from the first active regions by the second device isolation layer.

15. The semiconductor device of claim 14, wherein the second active regions are spaced apart by the first device isolation layers and are connected to each other by the substrate.

16. The semiconductor device of claim 14, wherein the second device isolation layer penetrates completely through the substrate.

17. The semiconductor device of claim 14, wherein the second device isolation layer surrounds the first active regions and surrounds the second active regions.

18. The semiconductor device of claim 14, wherein the second substrate structure further comprises a via penetrating through the second device isolation layer, the via configured to supply a power voltage or a ground voltage to the circuit devices.

19. The semiconductor device of claim 14, wherein lower surfaces of the first device isolation layers are at substantially a same level as a lower surface of the second device isolation layer.

20. A data storage system comprising:
a semiconductor storage device including
a first substrate structure including
gate electrodes, and
first bonding metal layers,
a second substrate structure including
a substrate including active regions,
device isolation layers in the substrate defining the active regions and including first device isolation layers and a second device isolation layer having different heights, the active regions including first active regions spaced apart by the first device isolation layers and connected to each other by the substrate, and second active regions separated from the first active regions by the second device isolation layer, circuit devices electrically connected to the gate electrodes, and second bonding metal layers connected to the first bonding metal layers, and an input/output pad electrically connected to the circuit devices; and a controller electrically connected to the semiconductor storage device through the input/output pad and configured to control the semiconductor storage device, wherein an upper surface of the second device isolation layer is located on substantially the same level as an upper surface of the substrate.

\* \* \* \* \*